(12) United States Patent
Goswami et al.

(10) Patent No.: US 7,783,855 B2
(45) Date of Patent: Aug. 24, 2010

(54) KEYMAP ORDER COMPRESSION

(75) Inventors: Sauraj Goswami, Palo Alto, CA (US);
You-Chin Fuh, San Jose, CA (US);
Michael R. Shadduck, Los Altos, CA (US); James Zu-Chia Teng, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 281 days.

(21) Appl. No.: 11/615,699

(22) Filed: Dec. 22, 2006

(65) Prior Publication Data

US 2007/0106876 A1 May 10, 2007

Related U.S. Application Data

(62) Division of application No. 11/233,956, filed on Sep. 9, 2005.

(51) Int. Cl.
*G06F 13/00* (2006.01)
*G06F 13/28* (2006.01)
*G06F 7/00* (2006.01)
*G06F 17/00* (2006.01)

(52) U.S. Cl. .................... 711/171; 707/693
(58) Field of Classification Search .......... 711/171; 707/101
See application file for complete search history.

(56) References Cited

U.S. PATENT DOCUMENTS

| | | | |
|---|---|---|---|
| 4,814,746 A | 3/1989 | Miller et al. | |
| 5,134,478 A | 7/1992 | Golin | |
| 5,335,344 A | 8/1994 | Hastings | |
| 5,465,337 A | 11/1995 | Kong | |
| 5,490,258 A * | 2/1996 | Fenner | 711/1 |
| 5,734,892 A | 3/1998 | Chu | |
| 5,737,257 A | 4/1998 | Chen et al. | |
| 5,781,906 A | 7/1998 | Aggarwal et al. | |
| 5,956,724 A | 9/1999 | Griffiths | |

(Continued)

FOREIGN PATENT DOCUMENTS

JP 09171476 A 6/1997

(Continued)

OTHER PUBLICATIONS

D.B. Lomet, "Prefix* B-Trees", IBM Technical Disclosure Bulletin, vol. 24, No. 5, Oct. 1981, pp. 2492-2496.

(Continued)

*Primary Examiner*—Shane M Thomas
*Assistant Examiner*—Michael Alsip
(74) *Attorney, Agent, or Firm*—Janet M. Skafar; Ingrid M. Foerster; Elissa Y. Wang

(57) ABSTRACT

Various embodiments of a computer-implemented method, system and computer program product are provided. A first plurality of key entries of a first index page are compressed in accordance with an order specified by a first keymap of the first index page. The first keymap also indicates respective positions of the key entries of the first plurality of key entries. A second keymap is generated indicating the order and also indicating respective post-compression positions of the key entries of the first plurality of key entries. The compressed first plurality of key entries is stored on a second index page with the second keymap.

21 Claims, 17 Drawing Sheets

Index page

U.S. PATENT DOCUMENTS

| | | | |
|---|---|---|---|
| 6,078,923 | A | 6/2000 | Burrows |
| 6,349,372 | B1 | 2/2002 | Benveniste et al. |
| 6,374,251 | B1 | 4/2002 | Fayyad et al. |
| 6,529,995 | B1 | 3/2003 | Shepherd |
| 6,546,385 | B1 | 4/2003 | Mao et al. |
| 6,549,895 | B1 | 4/2003 | Lai |
| 6,647,386 | B2 | 11/2003 | Hollines, III et al. |
| 6,819,271 | B2 | 11/2004 | Geiger et al. |
| 6,832,264 | B1 | 12/2004 | Sheinwald et al. |
| 2002/0006204 | A1 | 1/2002 | England et al. |
| 2002/0144078 | A1 | 10/2002 | Topham et al. |
| 2004/0148301 | A1* | 7/2004 | McKay et al. ............. 707/101 |
| 2004/0148302 | A1* | 7/2004 | McKay et al. ............. 707/101 |
| 2004/0148303 | A1* | 7/2004 | McKay et al. ............. 707/101 |
| 2005/0165794 | A1* | 7/2005 | Mosescu ................... 707/100 |

FOREIGN PATENT DOCUMENTS

| | | | |
|---|---|---|---|
| JP | 2004062475 A | 2/2004 | |

OTHER PUBLICATIONS

J. Teuhola, "A General Approach to Compression of Hierarchical lindexes," Database and Expert Systems Applications, 12th International Conference, DEXA 2001, Munich, Germany, Sep. 3-5, 2001, Proceedings, Lecture Notes in Computer Science, vol. 2113, pp. 775-784.

LZW—Wikipedia, the free encyclopedia, [online] page last modified on Jul. 9, 2005 [retrieved on Aug. 2, 2005] Retrieved from the Internet: <URL: http://en.wikipedia.org/wiki/LZW> 3 pages.

David Salomon, "Data Compression: The Complete Reference", 2nd edition, copyright 2000, 1998 Springer-Verlag New York, Inc., pp. 154-157.

"Managing Tables", Oracle9i Database Administrator's Guide, Release 2 (9.2), Part No. A96521-01, [online] copyright 2001, 2002 Oracle Corporation [retrieved on Sep. 2, 2005] Retrieved from the Internet: <URL: http://www.Ic.leidenuniv.nl/awcourse/oracle/server.920/a96521/tables.htm> 32 pages.

"Managing Indexes", Oracle8i Database Administrator's Guide, Release 8.1.5, A67772-01, [online] copyright 1999 Oracle Corporation [retrieved on Aug. 26, 2005] Retrieved from the Internet: <URL: http://www.csee.umbc.edu/help/oracle8/server.815/a67772/indexa.htm> 12 pages.

Dave Aldridge, "A Practical Guide to Data Warehousing in Oracle, Part 2", [online] copyright 2005 Jupitermedia Corporation [retrieved on Aug. 26, 2005] Retrieved from the Internet: <URL: http://www.dbasupport.com/oracle/ora9i/datawarehousing03.shtml> 5 pages.

Ian Smith, Lilian Hobbs, Ken England, "Rdb: A Comprehensive Guide", [online] Published 1999, Digital Press [retrieved on Oct. 24, 2007], Retrieved from the Internet: <URL: http://books.google.com/books?id=ywLkCgIPfFYC&pg=PA131&lpg=PA131&dq=index+prefix+compression&source=web&ots=sIZZInBnA-&sig=tfXiKuljOFcUzVgTX3NyJa7zATI#PPA130,M1>, pp. 130-134, <5 pages >.

Non-Final Office Action for U.S. Appl. No. 11/233,956 having a notification date of Apr. 23, 2008 <10 pages>.

Final Office Action for U.S. Appl. No. 11/233,956 having a notification date of Oct. 28, 2008 <11 pages>.

Non-Final Office Action for U.S. Appl. No. 11/233,956 having a notification date of May 4, 2009 <12 pages>.

Final Office Action for U.S. Appl. No. 11/233,956 having a notification date of Sep. 30, 2009 <14 pages>.

Non-Final Office Action for U.S. Appl. No. 11/233,956 having a notification date of Mar. 11, 2010 <13 pages>.

* cited by examiner

Index page

Key entry

Key entry

Physical page

Exemplary physical page

Physical page

KEYMAP ORDER COMPRESSION

This application is a divisional of prior application Ser. No. 11/233,956, filed Sep. 9, 2005. application Ser. No. 11/233,956 is hereby incorporated by reference in its entirety.

BACKGROUND OF THE INVENTION

1.0 Field of the Invention

This invention relates to database management systems; and in particular, this invention relates to index page compression in a database management system.

2.0 Description of the Related Art

Database management systems allow large volumes of data to be stored and accessed efficiently and conveniently in a computer system. In various database management systems, data is stored in database tables which organize the data into rows and columns. FIG. 1 illustrates a table 30 and index 31 of a database. In the table 30, a row 32, 34 has one or more columns 36, 38 and 40. In a relational database management system, tables may be associated with each other. The data in one column of a table may be used to refer to data in another table. The term "record" is also used to refer to a row of data in a table.

The index 31 can be used to quickly access the data. The index provides reference to the rows in the table 30. Each row 32, 34 of the table 30 is associated with a row identifier (rid) 42, 44, respectively. A user typically defines a key which comprises one or more columns of the table, and an index is generated based on sorting the rows in accordance with the value in the column(s) which form the key. Typically, a key comprises less than all the columns of the table. The sorted keys 46 with their associated rids 48 are stored in the index 31. In response to a query on a table having an index, the database management system accesses the index to find the record(s) which satisfy the query. In particular, the database management system accesses the index based on the key(s) which satisfy the query to retrieve the associated rid(s) which are used to retrieve the desired data from the rows.

The index is typically created as one or more index pages in volatile memory, such as semiconductor memory, and stored in persistent storage, such as a disk. In the persistent storage, the index is stored in one or more physical pages. The index may also be retrieved from persistent storage. In the volatile memory, the index is stored in one or more index pages; and each index page corresponds to a physical page in persistent storage. The size of the physical page is typically predetermined and fixed. Storing an index on a disk may consume a large amount of space on the disk. Hence there is a need to reduce the amount of space used by an index on a disk. Therefore it would be desirable to use index compression in order to allow an index page to fit on a physical page which is smaller than the index page.

As keys and/or rids are added to any given index page, the overhead associated with ensuring that the index page can be compressed to fit in the physical page can be significant. Ensuring that the data on an index page can be compressed to the smaller fixed page size can incur significant overhead and degrade performance. Performing a compressibility check every time index data is to be added to or updated on the index page can degrade performance. Therefore there is a need for a technique to avoid performing a compressibility check on every addition to or update of an index page.

In addition, because rows, and therefore keys, can be arbitrarily deleted and inserted in an index, "holes" may occur in an index page, and a free space chain is used to keep track of the holes. The holes and the free space chain consume space that could otherwise be used to store additional index information. Therefore, there is also a need for a technique which eliminates holes on an index page.

SUMMARY OF THE INVENTION

To overcome the limitations in the prior art described above, and to overcome other limitations that will become apparent upon reading and understanding the present specification, various embodiments of a computer-implemented method, system and article of manufacture are provided to maintain a logical page having a predetermined size. Data is added to an uncompressed area of the logical page. The uncompressed area of the logical page is associated with an uncompressed area of a physical page. The logical page also has a compressed area associated with a compressed area of a physical page. In response to exhausting the uncompressed area, data in the uncompressed area is included in the compressed area. The uncompressed area is adjusted.

In addition, various other embodiments of a computer-implemented method, system and computer program product are provided to maintain a logical page. In some embodiments, index data on an index page is compressed in accordance with a keymap which specifies an order of one or more key entries of the index data. In some embodiments, an amount of space to store index data on an index page is determined. The amount of space is based on the size of the physical page. If the amount of space is sufficient to contain new index data in an uncompressed format, the new index data is added to the index page.

In some embodiments, a computer system maintains an index. The computer system comprises an index page and a physical page. The index page is stored in volatile memory and comprises one or more first key entries and one or more second key entries. The physical page is stored in persistent storage and is associated with the index page. The physical page comprises the one or more first key entries in a compressed format, and the one or more second key entries in an uncompressed format.

In this way, various embodiments of a technique are provided which use index compression to reduce the amount of space used by an index page in persistent storage. In addition, various embodiments of a technique which avoids performing a compressibility check on every addition to or update of an index page are also provided. In addition, various embodiments of another technique which eliminates one or more holes on an index page are provided.

BRIEF DESCRIPTION OF THE DRAWINGS

The teachings of the present invention can be readily understood by considering the following description in conjunction with the accompanying drawings, in which.

To facilitate understanding, identical reference numerals have been used, where possible, to designate identical elements that are common to some of the figures.

DETAILED DESCRIPTION

After considering the following description, those skilled in the art will clearly realize that the teachings of the various embodiments of the present invention can be utilized to avoid performing a compressibility check on every addition to or update of an index page. Various embodiments of a computer-implemented method, system and article of manufacture to maintain a logical page having a predetermined size are provided. Data is added to an uncompressed area of the logical page. The uncompressed area of the logical page is associated with an uncompressed area of a physical page. The logical page also has a compressed area associated with a compressed area of a physical page. In response to exhausting the uncompressed area, data in the uncompressed area is included in the compressed area. The uncompressed area is adjusted. In various embodiments, the logical page is an index page. In other embodiments, the logical page contains column-data from the columns of the table.

In some embodiments, the logical page is an index page, and index data on the index page is compressed in accordance with a keymap which specifies an order of one or more key entries of the index data. In some embodiments, an amount of space to store index data on an index page is determined. The amount of space is based on the size of the physical page. If the amount of space is sufficient to contain new index data in an uncompressed format, the new index data is added to the index page.

In various embodiments, a computer system maintains an index. The computer system comprises an index page and a physical page. The index page is stored in volatile memory and comprises one or more first key entries and one or more second key entries. The physical page is stored in persistent storage and is associated with the index page. The physical page comprises the one or more first key entries in a compressed format, and the one or more second key entries in an uncompressed format.

Figure 2:
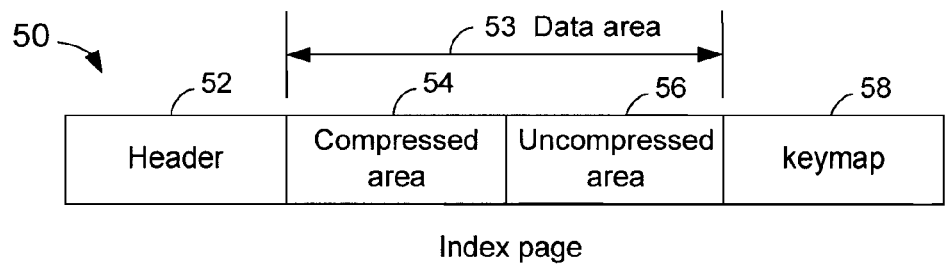
FIG. 2 depicts an embodiment of an index page.

FIG. 2 depicts an embodiment of an index page 50. The index page 50 is typically stored in volatile memory. The index page 50 has a header 52, a data area 53 and a keymap 58. The header 52 typically has a predetermined length. In this embodiment, the data area 53 comprises a compressed area 54 and an uncompressed area 56. Key entries are stored in the data area 53. The compressed area 54 contains those key entries that will be stored in a compressed format in a compressed area of a physical page. The key entries in the compressed area 54 of the index page 50 are stored in an uncompressed format, although those key entries are stored in the compressed format in the corresponding compressed area of the physical page. The uncompressed area 56 contains those key entries that will be stored in an uncompressed format in an uncompressed area of the physical page. The keymap 58 contains offsets to the key entries in the data area. The keymap 58 contains an offset, also referred to as a keymap element, to each key entry in the data area. The keymap grows from the end of the index page to the front of the index page as keymap elements are added. A keymap element is added in response to adding a key entry to the index page. The index page is typically stored in an area of volatile memory which is referred to as a buffer pool. The size of the index page is typically greater than the size of the physical page. In some embodiments, the index page size is 16K bytes; in other embodiments, the index page size is 8K bytes. However, the invention is not meant to be limited to an index page size of 16K bytes or 8K bytes, and other sizes of index pages may be used. In addition, in various embodiments, the physical page size is 4K bytes; however, the invention is not meant to be limited to a physical page size of 4K bytes and other sizes of a physical page may be used.

Figure 3:
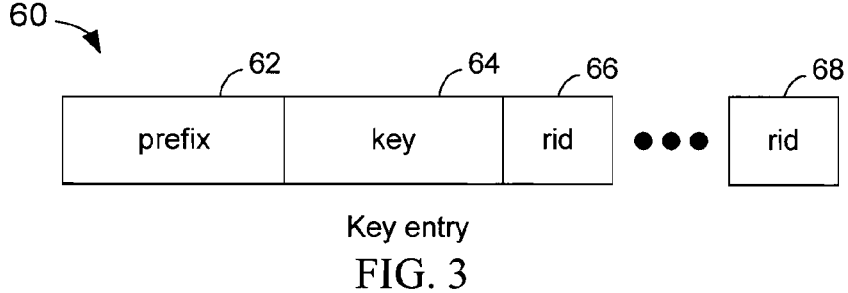
FIG. 3 depicts an embodiment of a key entry.

FIG. 3 depicts an embodiment of a key entry 60 which is stored in the data area 53 of FIG. 2. The key entry 60 has a prefix 62, a key field or key 64 and one or more rids, 66 to 68. The prefix 62 has a predetermined length, and comprises the length of the key 64 and the number of contiguous rids at the end of the key. The key field 64 contains the key, that is, the value of the key.

Figure 4:
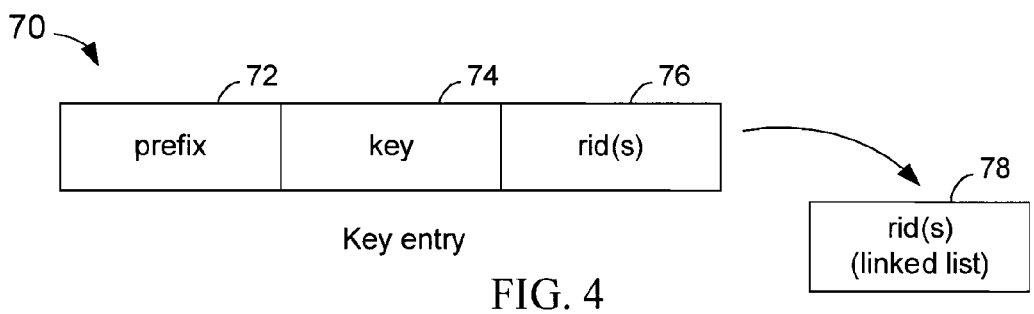
FIG. 4 depicts another embodiment of a key entry.

FIG. 4 depicts another embodiment of a key entry 70 which is stored in the data area 53 of FIG. 2. The key entry 70 has a prefix 72, a key field 74 and one or more rids 76 to 78. In this example, a linked list 78 associates additional rids with the key field 74. The linked list 78 is also referred to as a rid chain.

Figure 5:
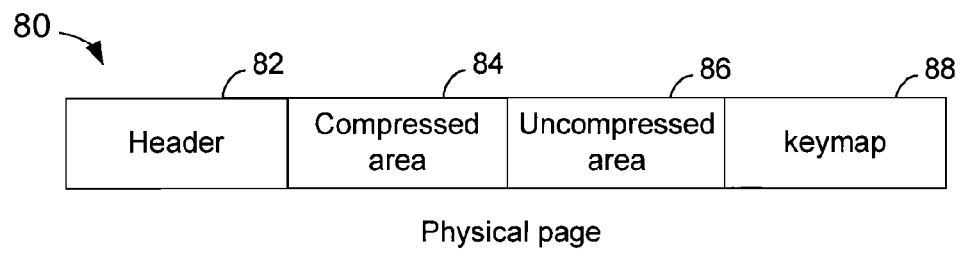
FIG. 5 depicts an embodiment of a physical page.

FIG. 5 depicts an embodiment of a physical page 80. The physical page 80 has a header 82, a compressed area 84, an uncompressed area 86 and a keymap 88. The compressed area 84 stores the key entries, in a compressed format, of the compressed area 54 of the index page 50 of FIG. 2. The uncompressed area 86 stores the key entries, in an uncompressed format, of the uncompressed data 56 of the index page 50 of FIG. 2. The header 82 of the physical page 80 contains the information of the header 52 of the index page of FIG. 2. The keymap 88 of the physical page 80 contains the information in the keymap 58 of FIG. 2. In the embodiment of FIG. 5, the compressed area 84 is contiguous to the uncompressed area 86. In various embodiments, the compressed area 84 is an unbroken sequence of bytes which have been output from a compressor; and the uncompressed area 86 is an unbroken sequence of bytes which have not been compressed.

A compressibility or compression check is typically performed to determine the compressed length of input data. The compressibility check typically implements a compression technique and compresses the data using that compression technique to determine the compressed length of the input data. Performing the compressibility check can be time consuming. In various embodiments, to avoid compressibility checking, a data area within the index page 50 (FIG. 2) that can remain uncompressed when stored on a physical page 80 (FIG. 5) in persistent storage, is maintained. This data area on the index page 50 (FIG. 2) is referred to as the uncompressed area 56 (FIG. 2). The uncompressed area 56 (FIG. 2) is used to add or update index data. The uncompressed area 56 (FIG. 2) acts as a repository for index additions and updates until the uncompressed area 56 (FIG. 2) is exhausted, at which time one compressibility check is made to incorporate the uncompressed area 56 (FIG. 2) of the index page 50 (FIG. 2) into the compressed area 54 (FIG. 2) of the index page 50 (FIG. 2). In some embodiments, a compressibility check is made in the form of a call to invoke a compression check module. For example, the uncompressed area 56 (FIG. 2) is exhausted in response to the uncompressed area 56 (FIG. 2) having insufficient space to add a new key entry, or alternately, one or more new rids to an existing key entry. The uncompressed 56 (FIG. 2) area may also be exhausted in response to a delete or pseudo-delete changing the compressibility of the data such that the compressed area 54 (FIG. 2) uses additional space. A new length for the uncompressed area 56 (FIG. 2) is then calculated. New index data may be added in the uncompressed area 56 (FIG. 2) based on the new length of the uncompressed area 56 (FIG. 2) and the length of the new index data.

In various embodiments, any index data 50 (FIG. 2) in the uncompressed area 56 (FIG. 2) remains uncompressed in the uncompressed area 86 (FIG. 5) on the physical page 80 (FIG. 5).

When a physical page is materialized to a logical page, that is, an index page, that index page will have its predetermined size with all the data uncompressed.

Figures 6, 6A:
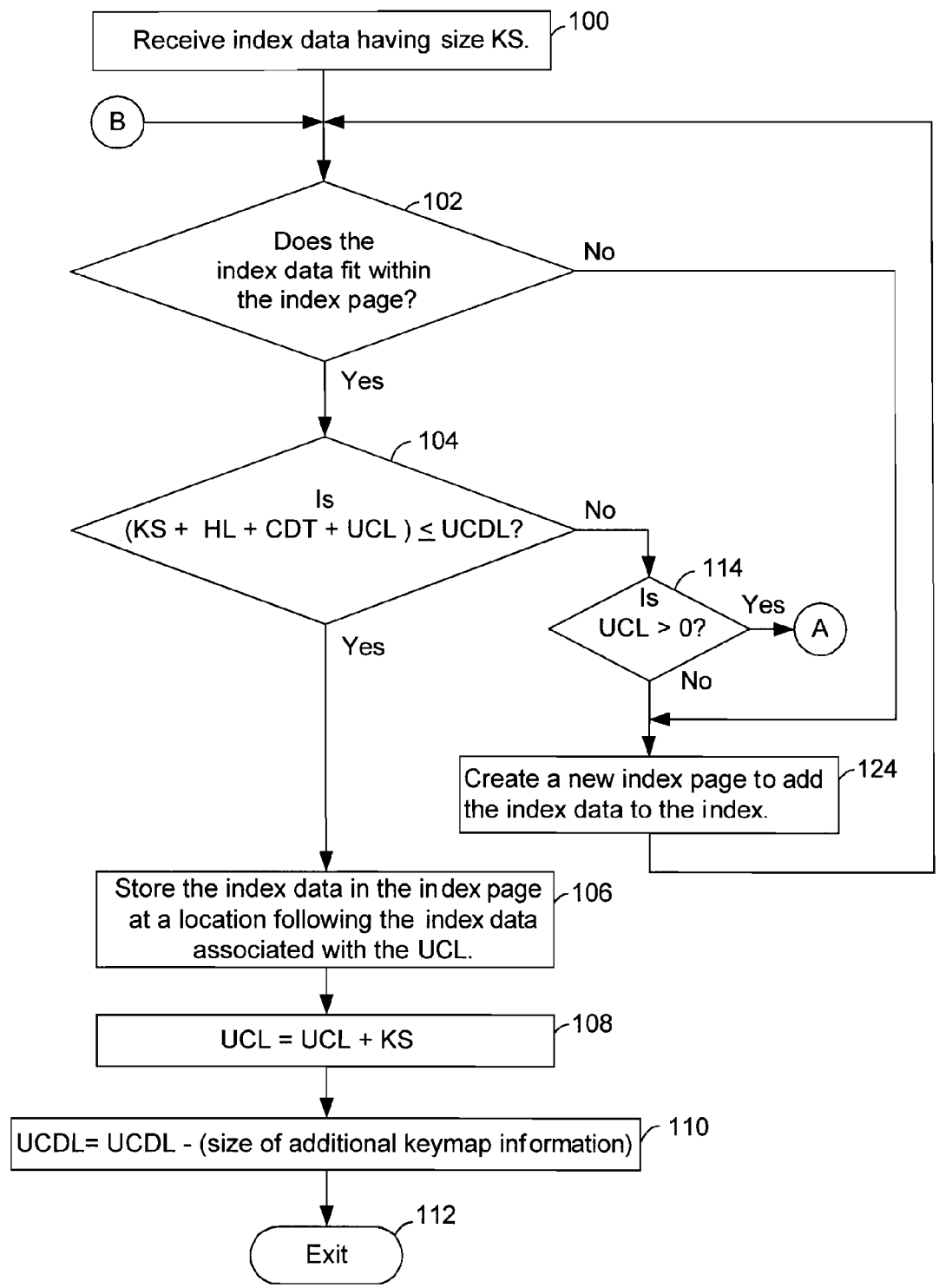
FIG. 6 comprises FIGS. 6A and 6B which collectively depict a flowchart of an embodiment of a technique of compressibility checking avoidance for an index page.
Figures 6B, 7:
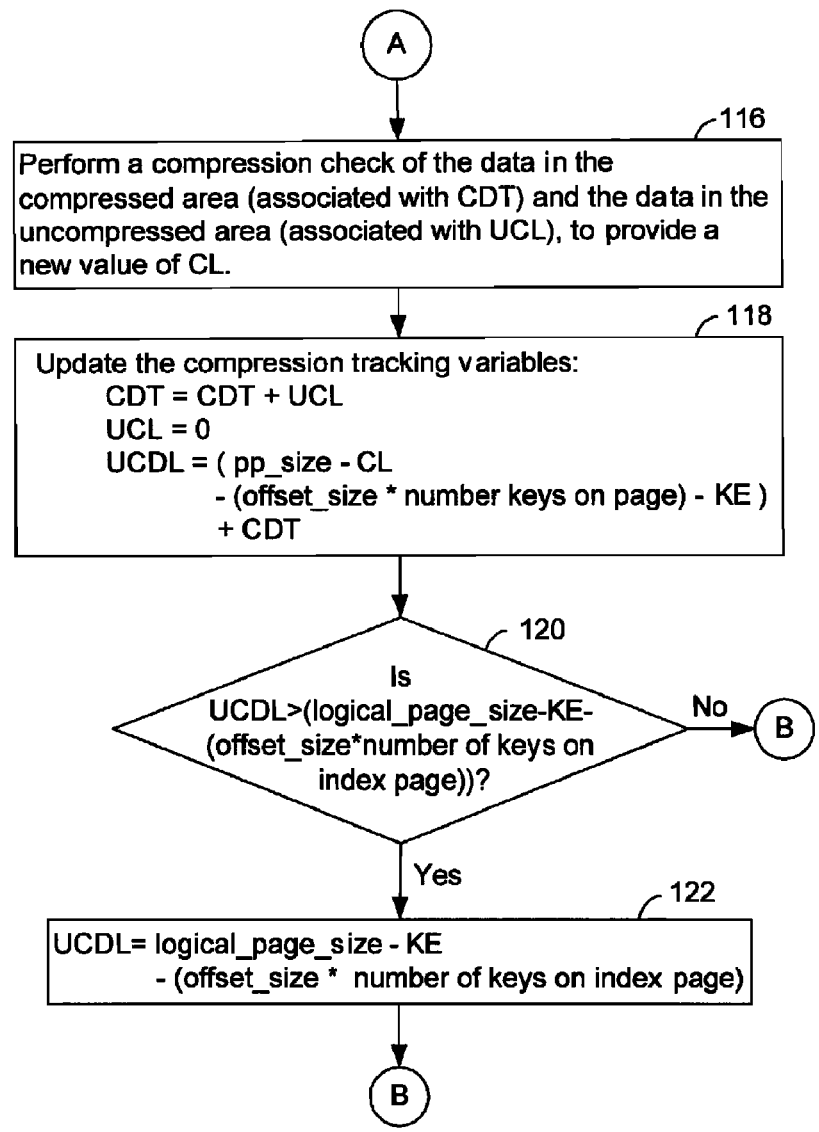
FIG. 7 depicts a flowchart of an embodiment of storing information in an index page on a physical page.

FIG. 6 comprises FIGS. 6A and 6B which collectively depict a flowchart of an embodiment of a technique of compressibility checking avoidance for an index page. In various embodiments, the flowchart of FIG. 6 is implemented in an index management system of a database management system. In some embodiments, in response to performing an insert, update, delete or pseudo-delete, a data management system of the database management system calls the index management system. Prior to performing the flowchart of FIG. 6, for a new index page, various compression tracking variables are initialized. For an existing index page, one or more of the index tracking variables are retrieved from the header. A total amount of data compressed variable (CDT) is equal to the uncompressed length of the compressed area 54 (FIG. 2) of the index page 50 (FIG. 2) If the index page 50 (FIG. 2) does not have any data in the compressed area 54 (FIG. 2), that is, there is no compressed area, for example, for a new index page, the total amount of data compressed variable (CDT) is set equal to zero. The compressed length of data variable (CL) is equal to the compressed length of the compressed area 54 (FIG. 2) of the index page 50 (FIG. 2). If the index page 50 (FIG. 2) does not have a compressed area 54 (FIG. 2), for example for a new index page, the compressed length of data variable (CL) is set equal to zero. The uncompressed data held variable (UCL) represents the amount of data in the uncompressed area 56 (FIG. 2) of the index page 50 (FIG. 2). For a new index page or after the data in the uncompressed area has been compressed and included in the compressed area, the uncompressed data held variable (UCL) is set equal to zero. The uncompressed data limit variable (UCDL) represents a point on the index page that acts as a boundary for the uncompressed data area, such that data is not to be added beyond the UCDL. For a new index page, the uncompressed data limit variable (UCDL) is set equal to the size of the physical page minus the size of one keymap element and the size of a page end indicator. In various embodiments, the header comprises a predetermined number of bytes and contains the compression tracking variables of CDT, CL, UCL and UCDL.

For example, the physical page size (pp_size) is predetermined, such as 4K bytes. In various embodiments, the header has a length (HL) of seventy-six bytes; however, the header is not meant to be limited to seventy-six bytes and in other embodiments, the header has a different predetermined length. The size of one keymap element and the page end indicator is predetermined and will be referred to as KE, and, for example, KE is four bytes. However, KE is not meant to be limited to four bytes and KE may have another value. Therefore, in this example, for a new index page, that contains no compressed or uncompressed data, the UCDL is determined as follows:

$UCDL = pp\_size - KE$ $UCDL = 4,096\ bytes - 4\ bytes$ $UCDL = 4,092\ bytes$

In step 100, index data having size KS is received. In some embodiments, the index data is a new key entry with a new key having size KS; in other embodiments, the index data is one or more rids associated with an update of an existing key.

Step 102 determines whether the index data fits within the index page. That is, whether the index data fits within the predetermined size of the index page in memory. If so, step 104 determines whether $(KS+HL+CDT+UCL) \leq UCDL$, that is, whether there is space in the uncompressed area for the index data.

If step 104 determines that $(KS+HL+CDT+UCL) \leq UCDL$, in step 106, the index data is stored on the index page at a location following the index data associated with the UCL. Thus the index data, such as a new key entry, is added to the uncompressed area of the index page at a position following a previously added key entry, or in some embodiment, a previously added rid. As a result, in various embodiments, index data is added to the uncompressed area of the index page starting at the end of the header for an empty index page, or starting at the end of the compressed area, and ending at or before the UCDL. In step 108, the length of the uncompressed data held UCL is incremented by KS. In step 110, UCDL is determined as follows:

$UCDL = UCDL - (\text{size of the additional keymap information})$.

In some embodiments, the size of the additional keymap information is equal to two bytes; however, the size of the additional keymap information and in other embodiments other sizes may be used. In step 112, the flowchart exits.

If step 104 determines that $(KS+HL+CDT+UCL) > UCDL$, step 114 determines whether $UCL > 0$. If so, step 104 proceeds via Continuator A to step 166 of FIG. 6B. In step 116, a compression check of the data in the compressed data (associated with CDT) and any data held in the uncompressed area (associated with UCL) is performed to provide a new value of CL. In various embodiments, the compression check module is called based on the index data in the compressed area and the index data in the uncompressed area, and the compression check module returns a new value of the compressed data length (CL). In various embodiments, the compression check module compresses the data in the compressed area and the data in the uncompressed area in byte order, starting with the byte after the header, which is typically the beginning of the compressed area, and ending with end of the last index data, for example, the last key entry in the uncompressed area after which there is unused space extending to the UCDL. In some embodiments, the compression check module also writes the compressed data in an output buffer in memory, which will be stored on the physical page. In step 118, the compression tracking variables are updated and stored in the header of the index page. CDT is incremented by UCL. UCL is set equal to zero. UCDL is determined as follows:

$$UCDL = (pp\_size - CL - (offset\_size * number\ keys\ in\ index\ page) - KE) + CDT.$$

The offset_size represents the size of an offset in the keymap, for example, in some embodiments, two bytes.

The UCDL is then checked to determine whether the UCDL is in the keymap or even off the index page. Step 120 determines whether the UCDL is greater than (logical_page_size−KE−(offset_size*number of keys on index page)). If so, in step 122, the UCDL is set equal to the logical_page_size−KE−(offset_size*number of keys on the index page). Step 122 proceeds via Continuator B to step 102 of FIG. 6A to determine if the index data having length KS will now fit in the uncompressed area.

In FIG. 6A, if step 114 determines that UCL is ≦0, a new index page will be created, also referred to as splitting an index page. In step 124, a new index page is created to add the new index data to the index, and the compression tracking values are stored in the header. The compression tracking values will be initialized such that UCDL is equal to the physical page size minus KE, CL=0, and CDT=0. The uncompressed data held (UCL) tracking value is set to a value indicating the amount of index data stored on the index page. Step 124 proceeds to step 102 of FIG. 6A to store the index data in an index page.

If step 102 determines that the index data does not fit within the index page, step 102 proceeds to step 124 of FIG. 6A to create a new index page to add the index data to the index.

Pseudo-code corresponding to an embodiment of the flowchart of FIG. 6 is shown below. The pseudo-code is performed when a key is to be inserted in an index page. The size of the index data, for example, a key entry, to be inserted is represented by KS.

```
Find_space_for_key_loop:
    If the index data having size KS will fit within
    the index page (that is, the additional index data will
    not result in the size of the index page exceeding its
    maximum size) Then
        If (KS + HL + CDT + UCL ≦ UCDL) Then
            Store the key in the uncompressed area in
            the location following the UCL
            UCL = UCL + KS
            UCDL= UCDL− Size of keymap element for new key entry
        Else
            If UCL > 0 Then
```

-continued

```
                Perform a compression check of the data area
                defined by CDT + UCL
                Calculate the new compression tracking values:
                    CL = returned by compression check
                    CDT = CDT + UCL
                    UCL = 0
                    UCDL = physical page size − CL − KE + CDT −
                        (offset_size * number keys on index page)
                    If UCDL > ( logical_page_size − KE −
                        ( offset_size * number of keys on
                        index page ) then
                        UCDL = ( logical_page_size − KE −
                            ( offset_size * number of keys on
                            index page ) )
                    Return to "Find_space_for_key_loop"
            Else
                A new index page is created to add the new key to
                the index
    Else
        A new index page is created to add the new key to the
        index
```

FIG. 7 depicts a flowchart of an embodiment of storing an index page on a physical page. In step 130, a physical page is stored in persistent storage based on the index page, the physical page comprising the header, one or more compressed key entries in the compressed data area, one or more uncompressed key entries in the uncompressed data area, and a keymap. The header comprises one or more compression tracking variables. In some embodiments, the representation of the physical page is contained in an output buffer area of volatile memory before being stored in the physical page.

Figure 8:
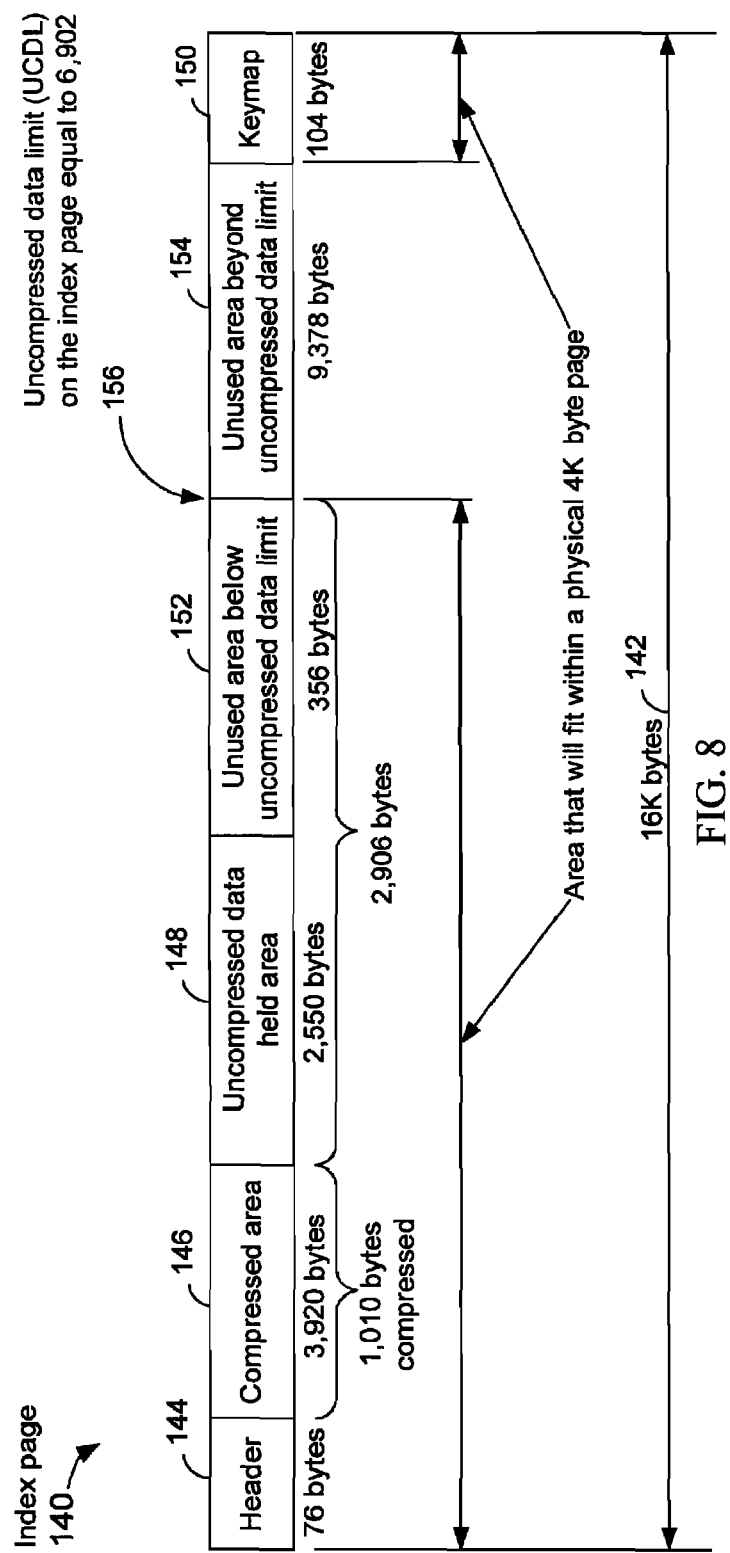
FIG. 8 depicts an illustrative index page.

FIG. 8 depicts an illustrative uncompressed index page 140 which is stored in memory, that is, in volatile storage. The index page 140 has a predetermined size of 16K bytes 142. The header 144 has 76 bytes. The compressed area 146 contains 3,920 bytes, that is, CDT=3,920, which will compress to 1,010 bytes, that is, CL=1,010. The uncompressed area comprises an uncompressed data held area 148 of 2,550 bytes, that is, UCL=2,550, and an unused area below the uncompressed data limit 152 of 356 bytes. The uncompressed data held area 148 comprises index data. The keymap 150 contains 104 bytes, and in this example, the 104 bytes of the keymap 150 includes the bytes for KE. The uncompressed data limit (UCDL) 156 is equal to 6,902, that is, byte position 6,902 with respect to the start of the index page. The unused area beyond the uncompressed data limit 154 has a length of 9,378 bytes. In various embodiments, because data may be deleted from an index page the uncompressed data held area 148 may have one or more holes and the value of UCL includes the holes, and the compressed area 146 may have one or more holes and the values of CL and CDT include the holes.

Figure 9:
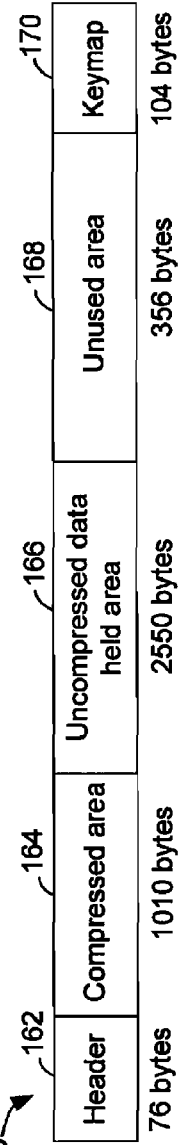
FIG. 9 depicts an illustrative physical page corresponding to the index page of FIG. 8.

FIG. 9 depicts an illustrative physical page 160 corresponding to the index page 150 of FIG. 8. The physical page 160 has a header 162, a compressed area 164, an uncompressed data held area 166, and an unused area 168 and a keymap 170. In this example, the physical page 160 contains 4K bytes, that is, 4,096 bytes. The header 162 of FIG. 9 is the same as the header 144 of FIG. 8. The compressed area 164 contains the data of the compressed area 146 of FIG. 8 in a compressed format, and therefore has a length of 1,010 bytes. The uncompressed data held area 166 is the same as the uncompressed data held area 148 of FIG. 8 and has 2,550 bytes. The unused area 168 has the same length as the unused area below the uncompressed data limit 152 of FIG. 8 of 356 bytes. The keymap 170 is the same as the keymap 150 of FIG.

8. Initially, after creation, the exemplary physical page 160 can store 4,016 bytes of uncompressed index data, which is equal to:

(4,096 bytes−76 bytes of header−0 bytes of compressed data−4 bytes (KE)).

Therefore, initially 4,016 bytes can be stored in the unused area below the uncompressed data limit of the uncompressed area of the index page 140 (FIG. 8), there is no compressed area, there is no uncompressed data held, and the uncompressed data limit (UCDL) on the index page is at byte 4,092.

In various embodiments, the index data comprises one or more key entries. In some embodiments, the index data comprises one or more rids. As index data is added to the index page 140, the index data is added in the uncompressed area at the end of the uncompressed data held area 148, the length of the uncompressed data held area (UCL) increases, and the length of the unused area below the uncompressed data limit (UCDL) decreases. In this way, a compressibility check is avoided. In this example, the unused area comprises unused areas 152 and 154. When the addition of more index data would cause that index data to be stored beyond the uncompressed data limit (UCDL), a compressibility check is made with the data in the compressed area 146 and the data in the uncompressed data held area 148. However, the new index data is not included in the compressibility check. For example, assume that the index page is as shown in FIG. 8 and that new index data having a length of 400 bytes is received. Adding 400 bytes at the end of the uncompressed data held area 148 would result in the new index data being stored beyond the UCDL; therefore, a compressibility check is performed. In this example, assume that the compressibility check compresses the 2,550 bytes of the uncompressed data held area 148 with the 3920 bytes of the compressed area 146 and yields a compressed length of 3,000 bytes. The uncompressed data limit (UCDL) on the index page is determined as follows:

$UCDL=4096-3,000$ bytes$+6,470$ bytes$-104$ bytes$=7,462$ bytes.

The unused area below the uncompressed limit is now equal to 7,462−76−6,470=916 bytes. Therefore 916 bytes are now available in the unused area below the uncompressed limit 152, and UCL is equal to zero. The new index data of 400 bytes can now be added to the uncompressed area of the index page.

The process of using the uncompressed area for adding new index data until exhausted and then recalculating, that is, adjusting the uncompressed space available on the index page, continues until the index data will not compress to fit on the 4K byte physical page. At this point, the index page will be considered full and a new index page is created, that is, the index page is split.

Various embodiments of compressibility checking avoidance have been described with respect to the uncompressed data limit (UCDL). In an alternate embodiment, an amount of available uncompressed space tracking variable is maintained and, in this embodiment, the flowchart of FIG. 6 is modified such that UCDL is no longer used and an uncompressed data area (UCDA) tracking variable is used. In FIG. 6B, step 118, the UCDA is determined as follows:

$UCDA=pp\_size-HL-CL-(\text{offset\_size}*\text{number of keys on page})-KE$

In addition, in this embodiment, FIG. 6A is also modified such that step 104 determines whether KS is less than UCDA. In step 110, UCDA is decremented by the size of the key entry KS. Steps 120 and 122 are omitted and step 118 proceeds via Continuator B to step 102 of FIG. 6A.

Figure 1:
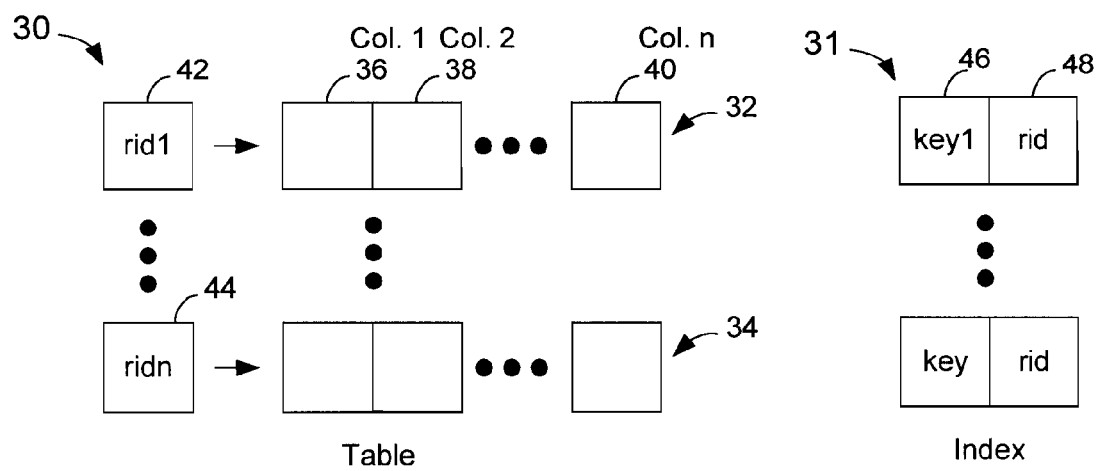
FIG. 1 depicts an illustrative table and index of a database management system.

The compressibility checking avoidance technique described above is not meant to be limited to index data; in other embodiments, the compressibility avoidance checking technique is applied to the data in a database table 30 (FIG. 1), that is, the table data. In these embodiments, the data in the rows of the table is compressed, and the compressibility avoidance technique is applied to that row data. The row data comprises the data in the columns of the key and data in the columns that are not part of the key.

Various embodiments of the invention use a Ziv-Lempel compression algorithm. Other embodiments use a modified Ziv-Lempel compression algorithm. A modified Ziv-Lempel compression technique is described in U.S. Pat. No. 4,814,746 to Miller et al. granted on Mar. 21, 1989. However, the invention is not meant to be limited to a Ziv-Lempel compression algorithm and other compression algorithms may be used.

Figure 10:
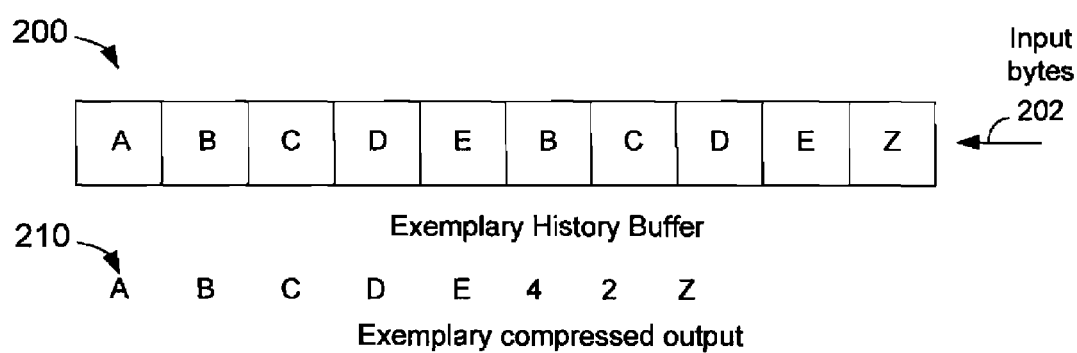
FIG. 10 depicts an illustrative history buffer used in Ziv-Lempel compression.

FIG. 10 depicts an illustrative history buffer 200 used in Ziv-Lempel compression. In the Ziv-Lempel family of compression algorithms, bytes are input sequentially into the circular history buffer 200. In a circular buffer, bytes are inserted into that buffer; and, in response to reaching the end of the buffer, bytes are inserted at the start of the buffer thereby overwriting previous data. In the history buffer 200, the following bytes, representing characters, are input, as indicated by arrow 202, to the history buffer 200 in the following order: "A, B, C, D, E, B, C, D, E, Z." As bytes arrive to be input to the history buffer, the bytes are compared to the contents of the history buffer 200. If a byte does not match a previous byte in the history buffer, that byte is output. If a new byte matches a previous byte in the history buffer, but the new byte's successor does not match the successor to that previous byte, the new byte is output. If a plurality of bytes match bytes that earlier entered in the history buffer, the length of the match, and the offset into the history buffer where the pattern appeared earlier are output. If such a plurality of bytes match more than one occurrence of such bytes in the history buffer (for example if there were more than one occurrence of "B, C, D, E" in the history buffer) then the bytes are matched with the earliest occurrence of those bytes in the history buffer. Since the history buffer is circular, the earliest occurrence refers to the pattern whose endpoint appears earliest in the history buffer. For example, in the history buffer, the first five bytes do not match any other characters in the history buffer and are output as literals. The sequence "B, C, D, E" repeats. The sequence has a length of four bytes and the position of the earliest occurrence of the sequence is equal to two. The output 210 corresponding to the data in the history buffer 200 is "A, B, C, D, E, 4, 2, Z." In general, the more patterns that are matched the better the compression; and the longer the pattern length that is matched, the better the compression.

When the second "B" was input to the history buffer, the first occurrence of "B" was still in the history buffer, which enabled a match to begin. If the first occurrence of "B" in the history buffer had been overwritten before the second occurrence of "B" was encountered, then no match of "B" would have been detected, and the next possible match is with "C". Thus the input is more compressible if the naturally occurring patterns in the input are more closely spaced.

Figure 11:
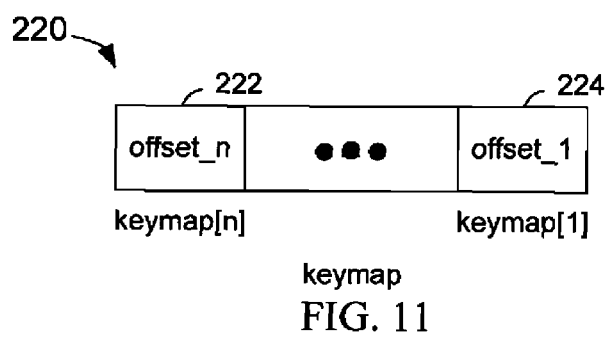
FIG. 11 depicts an embodiment of a keymap.

FIG. 11 depicts an embodiment of a keymap 220. The keymap 220 is an array comprising one or more offsets, offset_n to offset_1 222 and 224, respectively, and each offset is referenced by its position in the keymap such that keymap[i]=offset_i. In various embodiments, the keymap is at the end of the index page and grows towards the beginning of the index page. Each offset is a value indicating a starting point of a key entry on the index page. The offsets are ordered in accordance with the order of the keys. For example, keymap [1] points to the key entry containing the key having the lowest value, and keymap[n] points to the key entry having the key with the highest value. Alternately, keymap[1] points to the key entry containing the key having the highest value, and keymap[n] points to the key entry having the key with the lowest value. The term "keymap element" may also be used to refer to an offset of the keymap array.

In various embodiments, the key entries are supplied to the compressor in accordance with the order specified in the keymap, referred to as keymap order index compression or keymap order compression. In various embodiments, keymap order refers to inputting the key entries to the compressor in accordance with a keymap index j, where j=1 . . . J, starting with the key entry referenced by keymap[1], the key entry referenced by keymap[2], and ending with the key entry referenced by keymap[J]. In this way, the values of the keys of the key entries may be closer for compression, and the compression ratio may be improved.

Referring back to FIGS. 3 and 4, a key entry has a key prefix, followed by the key itself, followed by one or more rids. In various embodiments, the rids are arranged contiguously on the index page, and in some embodiments the rids are arranged using a linked list which is referred to as a rid chain. The term "ridindex" refers to an index into a contiguous array of rids or the linked list of rids. Since keys and rids may be arbitrarily inserted into and deleted from an index page, the index page may have "holes". A free space chain keeps track of the holes. The index page typically has a header which contains information regarding the number of keys on the page, and the head of the free space chain.

Figure 12:
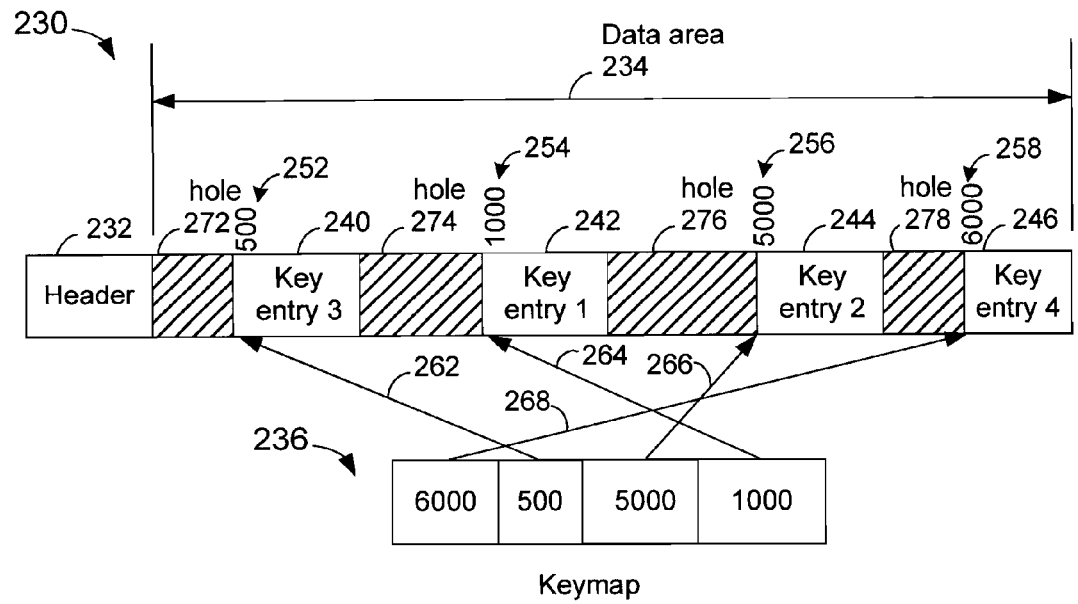
FIG. 12 depicts another embodiment of an index page.

FIG. 12 depicts another embodiment of an index page 230. The index page has a header 232, data area 234 and keymap 236. The data area 234 is uncompressed; and the key entries 240, 242, 244 and 246 are distributed throughout the data area 234. The four key entries 240, 242, 244 and 246, are located at different offsets 252, 254, 256 and 258, respectively, within the index page 230. The keymap 236 contains the values of the offsets in accordance with the order of the value of the keys. Keymap[1] is equal to 1000 which is the starting location of key entry 1, that is, at byte 1000. Keymap[2] is equal to 5000 which is the starting location of key entry 2. Keymap [3] is equal to 500 which is the starting location of key entry 3. Keymap[4] is equal to 6000 which is the starting location of key entry 4. The arrows 262, 264, 266 and 268 indicate the offset of the associated key entries 240, 242, 244 and 246, respectively. The key entries 240-246 are not stored in order in accordance with the values of their keys in the data area.

For example, assume that the keymap points to the key entries in ascending order such that that keymap[1] points to key entry 1 which has a key with a value of "apple", keymap [2] points to key entry 2 which has a key with a value of "avocado", keymap[3] points to key entry 3 which has a key with a value of "peach" and keymap[4] points to key entry 4 which has a key with a value of "pear". The keymap illustrated above references the key entries in ascending order. In an alternate embodiment, the keymap references the key entries in descending order.

The key entries 240-246 are not contiguous and there are holes 272, 274, 276 and 278 in the data area because keys and rids may have been added and deleted. In the index page 230, a hole 272, 274, 276 and 278 is an area that does not contain a key entry or rid data. In various embodiments, using keymap order compression, a new key entry may be added to a hole if that hole has sufficient space to contain that key entry. In other words, using keymap order compression, new key entries may be distributed about the index page rather than being added contiguously.

Various embodiments of key map order index compression, also referred to as keymap order compression, will reduce the number of holes on the index page, and the size of the free space chain. In various embodiments, keymap order compression eliminates the holes on an index page when writing the index page to a disk, and therefore, when read from the disk into memory, the index page will have no holes. If the index page is compressed by sending the information in the data area of the index page to the compressor in byte order, the holes are sent to the compressor in addition to the key entries. In various embodiments, using keymap order compression, the input data to the compressor comprises the key entries with their rids, and not the holes. For example, the keymap is read, and starting with keymap[1] the first offset which has a value of 1000, is read and used to retrieve key entry 1 which is sent to the compressor. Keymap[2] is used to retrieve the second offset which has a value of 5000, which is used to retrieve key entry 2 which is then sent to the compressor. Keymap[3] is used to retrieve the third offset which has a value of 500, which is used to retrieve key entry 3 which is sent to the compressor. Keymap[4] is used to retrieve the fourth offset which has a value of 6000, which is used to retrieve key entry 4, which is sent to the compressor. In this way, some additional compression may be achieved by skipping the holes and, in some embodiments, the free space chain.

In various embodiments of keymap order compression, only elements of the index page which are necessary for recreating a logically equivalent version of the index page when decompressed are compressed. Since free space chains embody physical organization of information on the index page, free space chains may be eliminated if the information on index page is configured in a certain way. In some embodiments, free space chains and rid chains are eliminated when the index page is compressed then decompressed, and a logically equivalent version of the original index page is provided. In various embodiments, the decompressed index page comprises key entries along with all their rids laid out end-to-end. In this way, free space chains are eliminated in the decompressed index page because there are no holes to keep track of.

In another embodiment, the bytes that are used to maintain rid chains are not compressed. The key entry, including the rids in any associated rid chain, is read, and sent to the compressor thereby eliminating that rid chain.

Using keymap order compression, key entries are sent to the compressor ordered in accordance with the value of their keys. Therefore the likelihood that key entries which have keys with common byte patterns which could be recognized by the compressor is increased.

Figure 13:
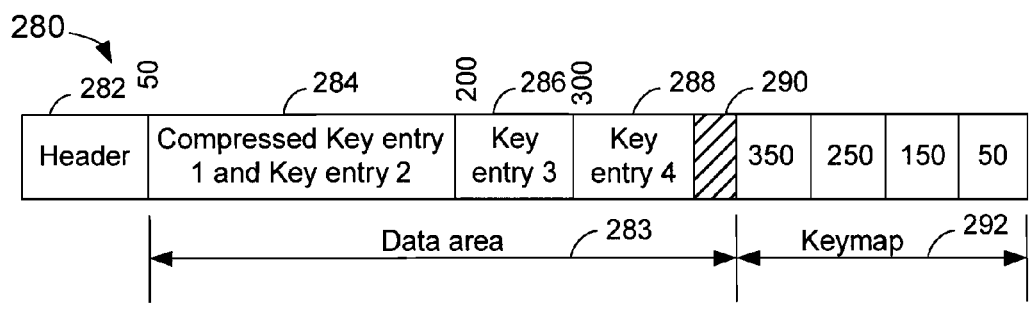
FIG. 13 depicts an exemplary physical page associated with the index page of FIG. 12.

FIG. 13 depicts an exemplary physical page 280 associated with the index page 230 of FIG. 12. In some embodiments, the information in the physical page 280 is also contained in an output buffer in volatile memory prior to being written to the physical page 280. The key entries of the index page of FIG. 12 have an uncompressed length of 100 bytes. Therefore the total uncompressed length of key entry 1 and key entry 2 is 200 bytes. In the exemplary physical page 280 of FIG. 13, key entries 1 and 2 have been compressed using keymap order compression and have an illustrative compressed length of 150 bytes. Key entries 3 and 4, 286 and 288, respectively, have not been compressed.

In keymap order compression, the values of the offsets, that is, keymap[ ], in the keymap array are recalculated. In this example, as shown in the keymap 292, after compression, keymap[1] has a value of 50 because the associated key entry follows a header which has a length of 50 bytes. However, the header is not meant to be limited to fifty bytes and in other embodiments, the header has a different predetermined length. The remaining keymap elements are recalculated as follows:

$$\text{keymap}[2] = \text{keymap}[1] +$$
$$\text{length of the key entry referenced by keymap}[1]$$
$$= 50 + 100$$
$$= 150$$

$$\text{keymap}[3] = \text{keymap}[2] +$$
$$\text{length of the key entry referenced by keymap}[2]$$
$$= 150 + 100$$
$$= 250$$

$$\text{keymap}[4] = \text{keymap}[3] +$$
$$\text{length of the key entry referenced by keymap}[3]$$
$$= 250 + 100$$
$$= 350.$$

In this example, key entry 1 and key entry 2 compress down to 150 bytes. Assume that the header 282 is 50 bytes. Compressed key entry 1 and key entry 2 284 are stored after the header 282 at location 50. Therefore, uncompressed key 3 is stored at a location equal to the header length+compressed keys=50+150=200 bytes. Key entry 4 is stored at the location following key entry 3, that is, location 300. Thus the physical page 280 appears as in FIG. 13. In a data area 283 of the physical page 280, the compressed area 284 begins at byte position 50 and contains compressed key entries 1 and 2 284 and has a length of 150 bytes. An uncompressed area begins at byte position 200 and contains key entry 3 and key entry 4, 286 and 288, respectively. The uncompressed area is followed by some unused space 290. The keymap 292 contains the recalculated values of the offsets, that is, keymap[ ], described above. The offsets, keymap[ ], in the keymap 292 are with respect to the logical, that is, the uncompressed index page that results from decompressing this physical page, and not the physical page.

Figure 14:
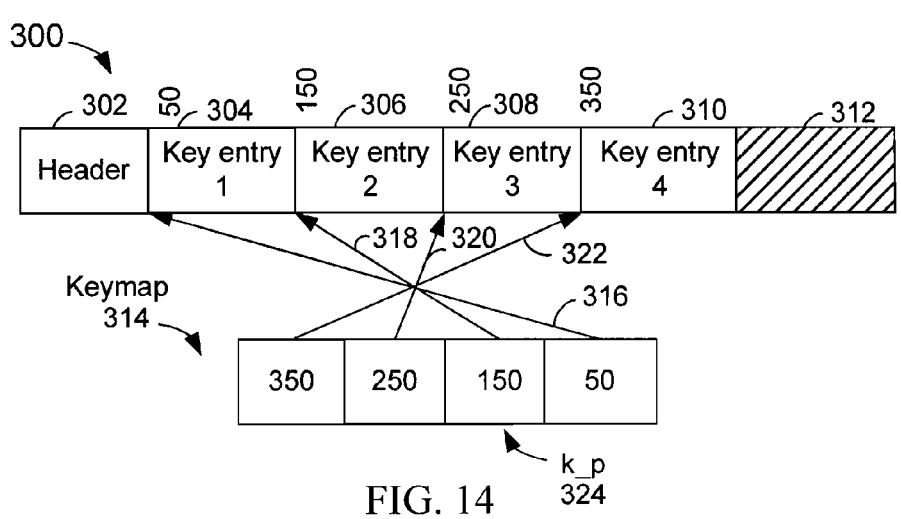
FIG. 14 depicts an illustrative index page after decompressing the physical page of FIG. 13.

FIG. 14 depicts an illustrative index page 300 after decompressing the physical page 280 of FIG. 13. The index page 300 has a header 302 which is the same as the header 282 on the physical page 280 of FIG. 13, and uncompressed key entries 1, 2, 3 and 4, 304, 306, 308 and 310, respectively. The uncompressed key entries 304-310 are contiguous and holes between the key entries have been eliminated, even though only two of the four key entries have been compressed. A keymap index pointer, k_p 324, contains a value j such that keymap[j] references the last key entry which was or, in some embodiments, will be compressed in keymap order. Key entries with keymap indexes greater than k_p are not compressed. In this example, k_p 324 has a value of two because the first two key entries are compressed, and k_p 324 points to the second keymap element, which in this example has a value of 150. The index page 300 has some unused space 312. The keymap 314 is the same as the keymap 292 stored in the physical page. After decompression, the offsets of the keymap 314 point to the correct location of their associated key entries in the index page 300, as indicated by arrows, 316, 318, 320 and 322.

Various embodiments of keymap order compression will now be described. The term "input_keymap" refers to the keymap that is on the index page which will be compressed; and the term "output_keymap" refers to the keymap on the compressed output page, that is, the physical page. When the compressed output page is later decompressed the output_keymap is the keymap of the decompressed index page.

The term "prefix-key" refers to the prefix and key of a key entry. The term "prefix-key(keymap[i])" refers to the prefix and key of the key entry that exists on the index page at the offset specified by keymap[i], and the variable "i" within the brackets is referred to as a keymap index. The term "length (prefix-key(keymap[i])" refers to the sum of the length of the prefix and the length of the key of the key entry at the offset specified by keymap[i].

The term "rids(keymap[i])" refers to all the rids that belong to key(keymap[i]). In some embodiments in which rid chains are used, rids(keymap[i]) also includes the rids in any rid chain in addition to the rids in the key entry that exist on the index page at the offset given by keymap[i]. In various embodiments, the term "page tail" (PT) refers to space at the end of an index page that is used for a validation check. In some embodiments, the term "page tail" refers to one or more bytes that indicate the end of the index page.

The number of offsets (num_offset) in the keymap is represented by num_offset(keymap). The keymap length (KMAPL) is determined as follows:

$$KMAPL = ((\text{num\_offset}(\text{keymap}))*(\text{size of the offset})) + PT.$$

In some embodiments, PT has a length of two bytes. However, in other embodiments, other values of PT may be used. In various embodiments of the index pages of FIGS. 12 and 14, the bytes of the page tail (PT) are after the keymap at the end of the page. In various embodiments of the physical page of FIG. 13, the bytes of the page tail (PT) are after the keymap at the end of the physical page.

The n elements of the keymap, keymap[i], are numbered from 1 to n, where keymap[1] refers to the first offset, and keymap[n] refers to the last offset.

In general, in an index page, a key entry comprises a prefix followed by the key itself which is followed by one or more rids. There may be other rids associated with this key which exist on a linked list called a rid chain the head of which might follow the rids directly after the key. In some embodiments, the prefix contains the number of rids that directly follow the key and does not take into account the keys in the rid chains. In various embodiments, since one of the effects of keymap order compression is to eliminate rid chains such that all the rids follow the key directly in the decompressed index page, the prefix is updated with the correct number of rids prior to supplying the prefix to the compressor. For example, assume that a key entry comprises four rids which directly follow the key and is associated with six more rids in a rid chain; therefore, the key is associated with a total of ten rids. The prefix of the key entry indicates that four rids follow the key. In this example, to compress this key entry, the prefix is updated to indicate that ten rids follow the key prior to sending the prefix to the compressor, and the ten rids are sent to the compressor following the key. After decompression, this key entry will have a key followed by ten rids.

In keymap order compression, the term "compressed length" (CLk) refers to the compressed length of one or more key entries. In keymap order compression, the "total uncompressed length" (CDTk) refers to the uncompressed length of the key entries, including rid chains, which have a compressed length of CLk. In keymap order compression, the term "non-compressed length" (NCLk) refers to the length of the key entries on an index page that have not been compressed, and in some embodiments, includes the rid chains associated with the uncompressed key entries.

The keymap index pointer, $k\_p$, contains a value which indicates the last key entry which was or, in some embodiments, will be, compressed in keymap order, such that, in various embodiments, compressing the key entries from keymap[1] to keymap[$k\_p$] yields the compressed length CLk.

In various embodiments, keymap order compression avoids a compression check. For example, in some embodiments, in response to inserting a new key entry, if that key entry is associated with a keymap index beyond the keymap indexes of the key entries which have been compressed, and if (HL+CL+NCL+KS+KMAPL+Size of 1 new key entry) is less than the physical page size, the new key entry is added to the index page and a compression check is avoided. However, keymap order compression is not meant to be limited to be used in combination with some embodiments of compression checking avoidance, and may be applied independently.

In various embodiments, there is no keymap index equal to 0. In some embodiments, for example in FIG. 15A and FIG. 15B below, the following convention is used. Although there is no keymap element such as keymap[0], in response to a keymap index of 0 occurring, the following conventions are used: length(prefix-key(keymap[0])) is set equal to 0, length (rids(keymap[0]) is set equal to 0, and output_keymap[0] is set equal to HL.

Figure 15A:
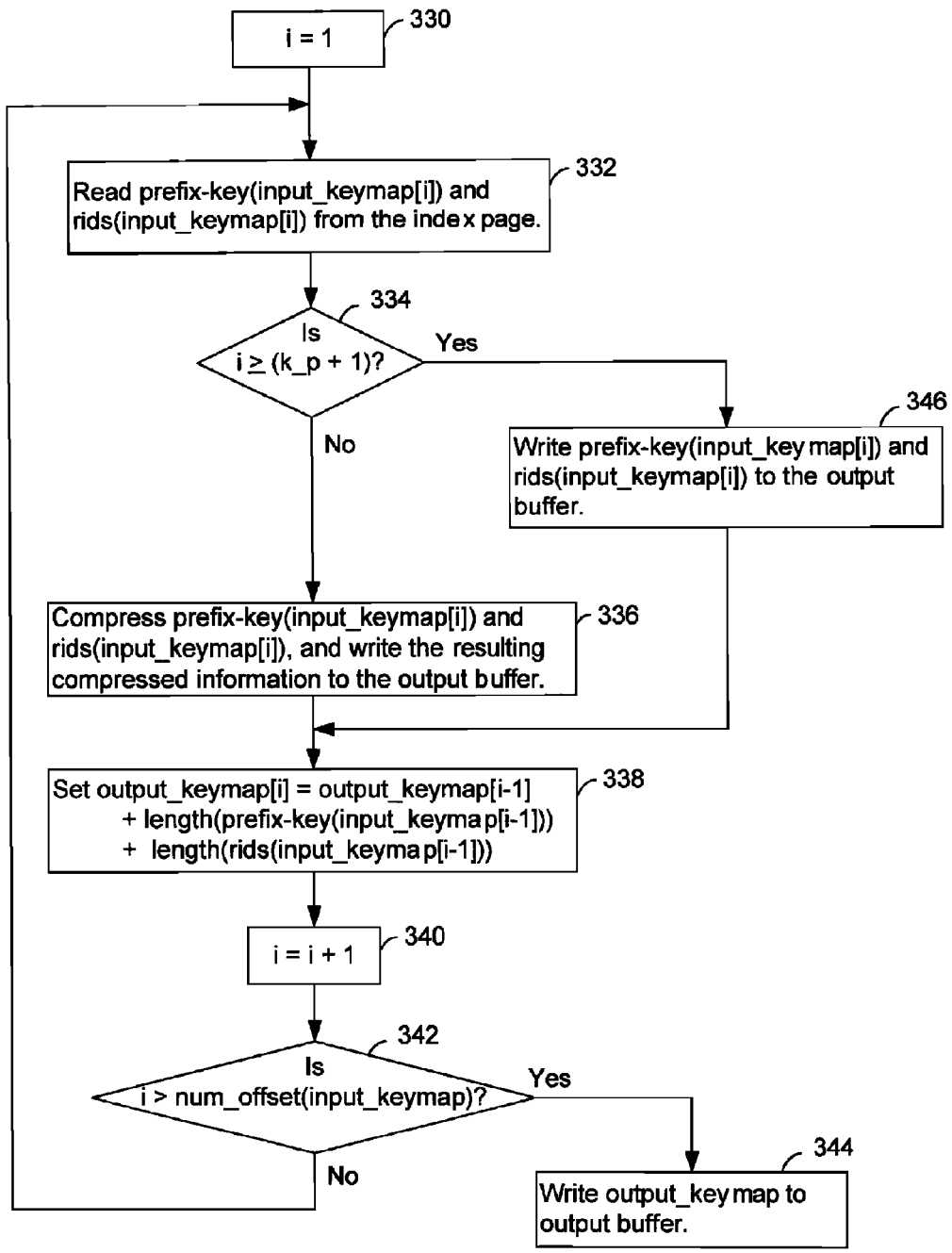
FIG. 15A depicts a flowchart of an embodiment of keymap order compression.

FIG. 15A depicts a flowchart of an embodiment of keymap order compression. In some embodiments, the flowchart of FIG. 15A is performed by the index management system. An index page having an input_keymap is in memory, the index page is associated with a keymap index pointer of $k\_p$. In step 330, a pointer i is set equal to one. The pointer "i" will be used to step through the keymap array.

In step 332, the prefix-key of the key entry referenced by keymap[i], that is, prefix-key(input_keymap[i]) is read from the index page, and the rids associated with that key entry, that is, rids(input_keymap[i]) are read from the index page. Step 334 determines whether i is greater than or equal to ($k\_p$+1). In this flowchart, $k\_p$ represents the last key entry which will be compressed. In some embodiments, $k\_p$ is set equal to num_offset(keymap). Alternately, $k\_p$ is set to a value less than num_offset(keymap).

In response to step 334 determining that i is less than ($k\_p$+1), in step 336, the prefix-key(input_keymap[i]) and rids(input_keymap[i]) are sent to the compressor, and the resulting compressed information is written to the output buffer. In step 338, output_keymap[i] is set equal to output_keymap[i-1]+length(prefix-key(input_keymap[i]))+length(rids(input_keymap[i])). In step 340, the value of i is incremented by one.

Step 342 determines whether the value of i is greater than num_offset(input_keymap), that is, whether i points beyond the keymap pointer. In other words, step 342 determines whether all the key entries on the index page have been processed and sent to the output buffer. If not, step 342 proceeds to step 332. If so, in step 344, the output_keymap is written to the output buffer.

If step 334 determines that i is greater than or equal to ($k\_p$+1), in step 346, the prefix-key(input_keymap[i]) and rids(input_keymap[i]) are written, in an uncompressed format, to the output buffer. Step 346 proceeds to step 338.

In various embodiments, the header is written to the output buffer and updated with $k\_p$, CLk, NCLk, and CDTk.

Figure 15B:
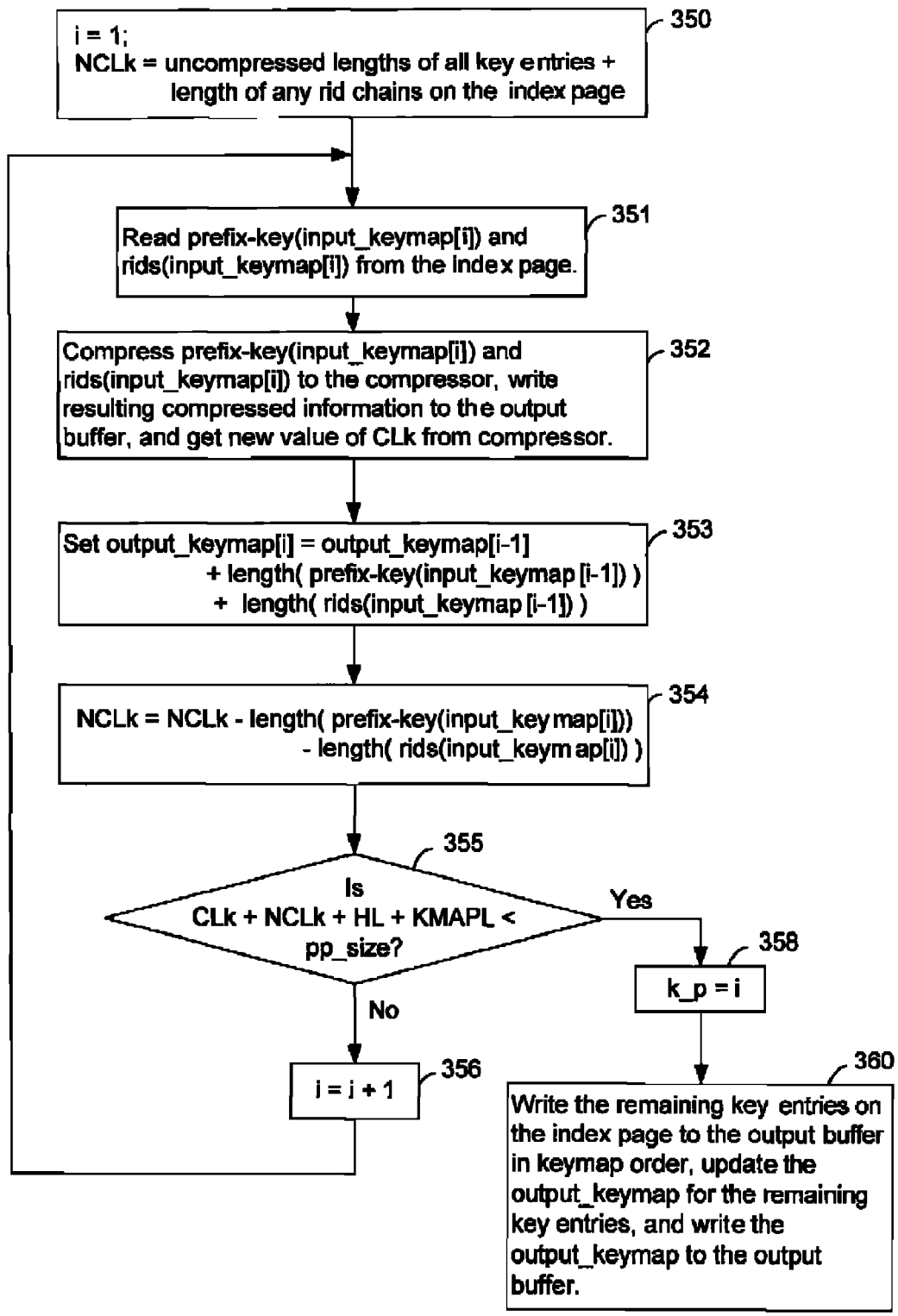
FIG. 15B depicts a flowchart of another embodiment of keymap order compression.

FIG. 15B depicts a flowchart of another embodiment of keymap order compression in which key entries are compressed in keymap order, and compression is stopped in response to compressing a sufficient number of key entries such that the index data on the index page will fit into the physical page. In various embodiments, the flowchart of FIG. 15B determines the value of $k\_p$ by stopping compression in response to compressing a sufficient number of key entries to fit on the physical page. In some embodiments, the flowchart of FIG. 15B is performed by the index management system.

In step 350, i is set equal to one. NCLk is set equal to the sum of the uncompressed lengths of all key entries and the length of any rid chains on the index page.

In step 351, the prefix-key of the key entry referenced by keymap[i], that is, prefix-key(input_keymap[i]) is read from the index page, and the rids associated with key entry, that is, rids(input_keymap[i]) are read from the index page. In step 352, the prefix-key(input_keymap[i]) and rids(input_keymap[i]) are compressed, the resulting compressed information is written to the output buffer, and a new value of CLk is retrieved.

In step 353, the output_keymap[i] is set equal to output_keymap[i-1]+length(prefix-key(input_keymap[i]))+length(rids(input_keymap[i])).

In step 354, NCLk is calculated as follows:

$$NCLk = NCLk - \text{length}(\text{prefix-key}(\text{input\_keymap}[i])) - \text{length}(\text{rids}(\text{input\_keymap}[i])).$$

Step 355 determines whether (CLk+NCLk+HL+KMAPL) is less than the physical page size (pp_size). If not, in step 356, i is incremented by one, and step 356 proceeds to step 351.

If step 355 determines that CLk+NCLk+HL+KMAPL is less than pp_size, in step 358, $k\_p$ is set equal to i. In step 360 any remaining key entries in the index page are written to the output buffer in uncompressed format in keymap order, the output_keymap is updated for those key entries, and the output_keymap is written to the output buffer.

In various embodiments, the header is written to the output buffer and updated with $k\_p$, CLk, NCLk, and CDTk.

Various embodiments of keymap order compression are based on inputting data to the compressor in an order such that data that are similar, namely keys of key entries which are adjacent in keymap order, are input close together so that matching patterns can be recognized and compressed. Because a key entry contains a key and one or more rids, if the number of rids is large, by the time the key in the next key entry is reached, the previous key may no longer be present in the history buffer. Furthermore, there may be similarity among the rids, especially for a clustering index. If a key is sufficiently large, the rids following the key may not have a chance to be compared against the rids of the previous key entry because the key may use a large portion of the history buffer. To further increase the likelihood of compression, in various embodiments, two different history buffers are used.

Figure 16:
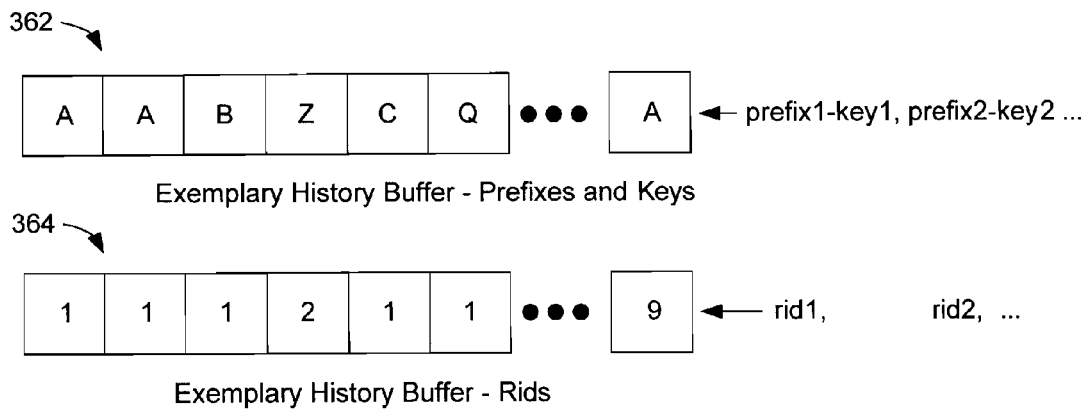
FIG. 16 depicts an embodiment of a compression technique, referred to as dual compression, which uses two history buffers.

FIG. 16 depicts an embodiment of compression technique, referred to as dual compression, which uses two history buffers 362 and 364. A first history buffer 362 is used to compress the prefix and key of the key entries. A second history buffer 364 is used to compress the rids. In various embodiments, two different compressors are used—one to compress the keys and the other to compress the rids. The prefixes and keys are sent to the first history buffer in accordance with the keymap order, and the rids are send to the second history buffer in accordance with the keymap order.

In other embodiments, a single compressor having two history buffers and two sets of associated tracking variables is used.

Figure 17:
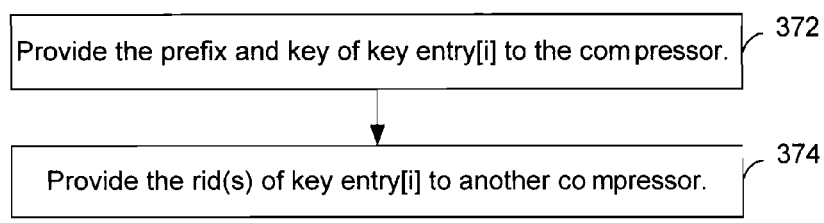
FIG. 17 depicts a flowchart of an embodiment of steps associated with the dual compression technique which uses the two history buffers of FIG. 16.

FIG. 17 depicts a flowchart of an embodiment of steps associated with the dual compression technique which uses the two history buffers of FIG. 16. In step 372, the prefix and key of key entry[i] are provided to a first compressor. In step 374, the rid(s) of key entry[i] are provided to a second compressor. In dual compression, the header, the compressed prefixes and keys, the compressed rids, any uncompressed key entries, and a keymap comprising the new offsets, that is, keymap[ ], are written to the physical page. The header comprises an entry which indicates the location in the index page where the compressed rids start.

In some embodiments, to perform the dual compression technique in a single pass of the index page, two output buffers are used. The result of compressing prefixes and keys is sent to a first output buffer, and the result of compressing rids is sent to a second output buffer. In some embodiments, after all keys and all rids on the index page have been compressed, the compressed rids output to the second output buffer are copied to the end of the compressed prefixes and keys in the first output buffer. Thus compressed rids will follow the compressed prefixes and keys, and the beginning of the compressed rids is tracked in the header. During decompression, the compressed prefixes and keys are passed to a first decompressor and compressed rids are passed to a second decompressor.

Alternately, dual compression is accomplished using a single output buffer and performing two passes over the index page. In a first pass, the prefixes and keys are compressed and written to the output buffer, and in a second pass the rids are compressed and written to the output buffer.

Figure 18:
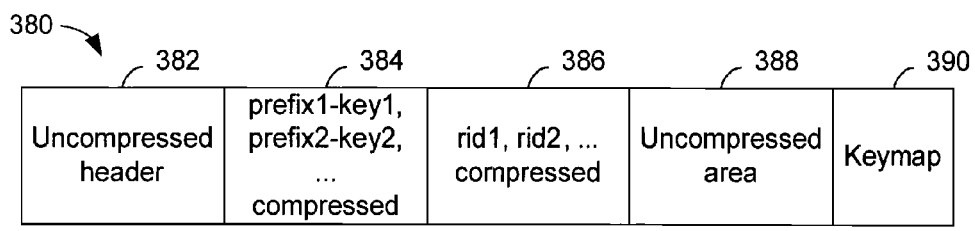
FIG. 18 depicts an embodiment of a physical page resulting from dual compression.

FIG. 18 depicts an embodiment of a physical page 380 resulting from dual compression. The physical page 380 comprises an uncompressed header 382, the compressed prefixes and keys 384, the compressed rids 386, an uncompressed area 388 comprising any uncompressed key entries, and a keymap 390 comprising the new offsets. In some embodiments, the key entries of the uncompressed area 388 are stored sequentially in keymap order as illustrated in FIG. 13.

In various embodiments, dual compression is used in step 336 of FIG. 15A and in step 352 of FIG. 15B.

Figure 19:
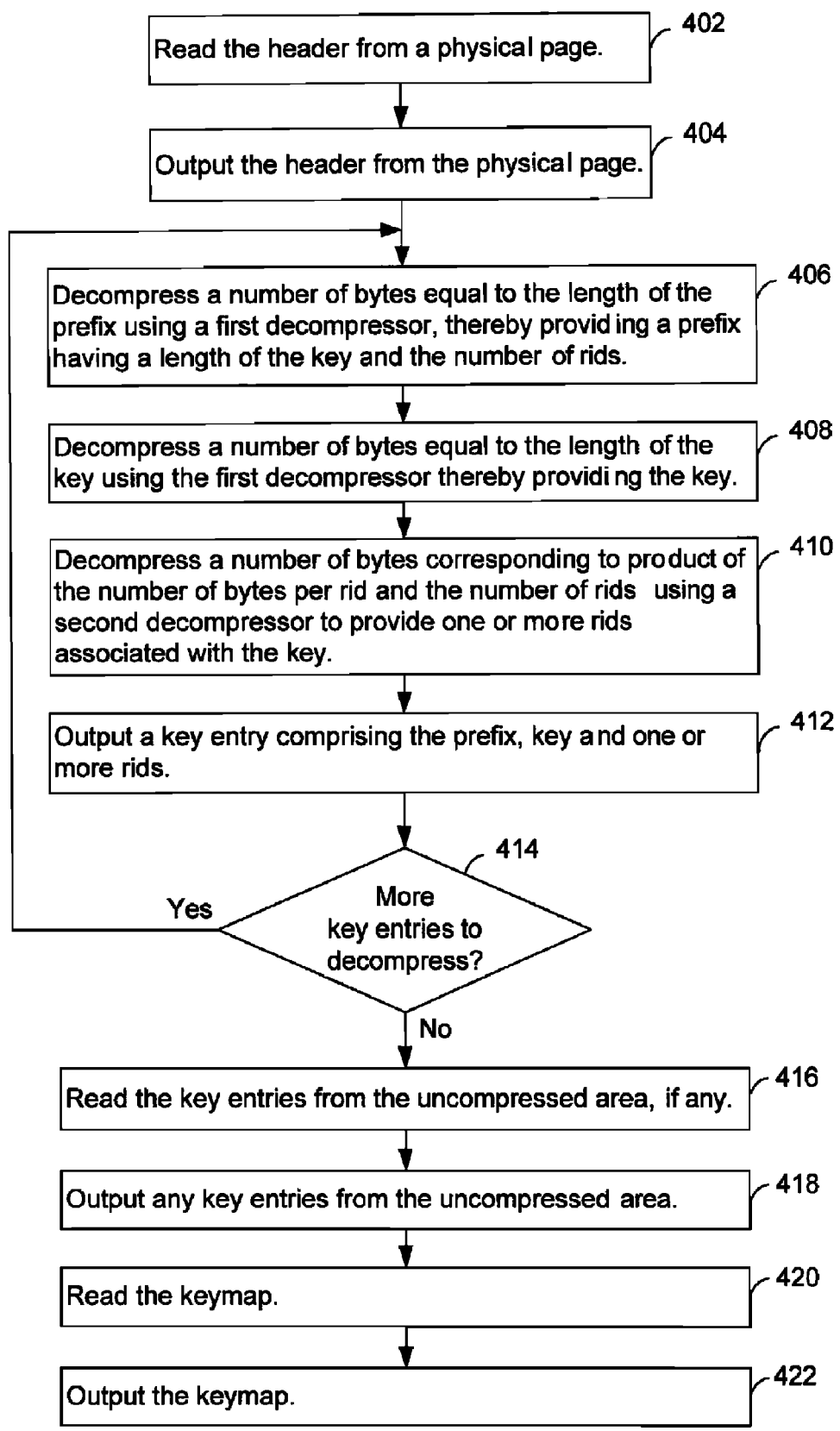
FIG. 19 depicts a flowchart of an embodiment of a decompressor for a physical page which was compressed using an embodiment of the dual compression technique of FIG. 17.

FIG. 19 depicts a flowchart of an embodiment of a decompressor for a physical page which was compressed using an embodiment of the dual compression technique of FIG. 17. The prefix of a key entry has a predetermined fixed length and contains the length of the key and the number of rids that follow the key. The rids also have a predetermined fixed length. In this embodiment, the decompressor will use this information to associate the decompressed rids with the appropriate key entry. In this embodiment, there are two decompressors. A first decompressor decompresses the prefixes and keys, and a second decompressor decompresses the rids.

In step 402, the header is read from a physical page. In step 404, the header is output from the physical page to the index page. In step 406, a number of bytes equal to the length of the prefix are decompressed using a first decompressor to provide a prefix having a length of the key and the number of rids associated with the key. In step 408, a number of bytes equal to the length of the key are decompressed using the first decompressor thereby providing the key. In step 410, a number of bytes corresponding to the product of the number of bytes per rid and the number of rids are decompressed using a second decompressor to provide one or more rids associated with the key. In step 412, a key entry comprising the prefix, key and one or more rids is output to the index page. Step 414 determines whether there are more key entries to decompress. If so, step 414 proceeds to step 406. In some embodiments, the header contains the length of the compressed prefix-key area and the location at which the compressed rids start, and step 414 determines that there are more key entries to decompress if, when decompressing the compressed prefix-key information, the location at which the compressed rids start has not been reached.

If step 414 determines that there are no more key entries to decompress, in step 416, the key entries, if any, are read from the uncompressed area. In this embodiment, any uncompressed key entries on the physical page are located at an offset of CLk from the header. If NCLk is greater than zero, a sequence of bytes of length NCLk which are located at an offset of CLk from the header on the physical page are read. In step 418, any key entries from the uncompressed area are output to the index page. The sequence of bytes of length NCLk which are located at an offset of CLk from the header on the physical page are copied to the decompressed index page. In step 420, the keymap is read from the physical page. In step 422, the keymap is output to the index page.

In an alternate embodiment, the prefix of the key entry does not contain the key length. In this embodiment, in step 406, the prefix contains a reference to a table which contains the key length, and the key length is retrieved from the table based on that reference.

Various embodiments of a compression code interface for keymap order compression will now be described. Initially an index page is empty. When the amount of index data plus the header plus the keymap reaches the size of the physical page, a module is called to determine how much the index data will compress down to. Various embodiments will refer to this module as comp_len. Comp_len is an embodiment of a compression check module. In some embodiments, the input to comp_len is the index page to be compressed and the keymap index pointer, k_p, up to which the index data will be compressed. For the first call to comp_len for an index page, the keymap index pointer k_p will correspond to the last offset of the keymap. After compression, the value of the keymap index pointer k_p is maintained in the header of the index page to indicate the last key entry which was compressed. The output from comp_len comprises:

1) The compressed length of one or more key entries which were sent to the compressor in keymap order, referred to as CLk; and
2) The length of any uncompressed key entries on the index page in keymap order, including the lengths of the rids in any rid chains, referred to as NCLk.

In various embodiments, the compressed length (CLk) of the key entries, and the length of the uncompressed key entries (NCLk) are stored in the header of the index page. In some embodiments, comp_len also returns the uncompressed length of the key entries whose compressed length is CLk, that is, the total data compressed (CDTk). In various embodiments, the uncompressed length of the compressed key entries (CDTk) is optional.

As described above, the length of the header is referred to as HL, and the length of the keymap, including the length of the page tail (PT), is referred to as KMAPL. In some embodiments, after a call to comp_len, if (CLk+NCLk+HL+KMAPL) is less than the size of the physical page, the index page is not split; otherwise, the index page is split. Splitting an index page means creating a new index page.

Various embodiments of a technique referred to as dynamic index page modification will now be described. The index page may be modified in various ways. A new key and rid may be arbitrarily inserted into an index page, a new rid may be inserted for an existing key, a rid may be pseudo-deleted, a key may be deleted, or a rid may be deleted. In a pseudo-delete, the rid is not physically deleted, a pseudo-delete indicator is set in the prefix that the key or a particular rid has been pseudo-deleted. Dynamic index page modification is used to determine whether a change to an index page will cause the sum of the length of the header, compressed index data, uncompressed index data and keymap exceeds the physical page size, that is, whether (CLk+NCLk+HL+KMAPL) is greater than the size of the physical page without modifying that index page.

In one embodiment, the index page is first modified with the change and then comp_len is called to find out if the changed index page will compress to below the size of the physical page. However, the change may result in the (CLk+NCLk+HL+KMAPL) of the index page to exceed the length of the physical page, and the index page will be split. The page is modified with the new index data, then comp_len is called to determine whether the index page with the new index data will sufficiently compress to fit on the physical page. Suppose comp_len returns a value of CLk such that the sum of CLk+NCLk+HL+KMAPL is greater than the physical page size, and the index page will be split, and the index management system waits for a split-latch. A steal occurs if the buffer manager decides to write the output buffer associated with the modified index page to the disk. In the event of a steal, the buffer manager will return an error because the modified index page cannot be compressed to fit on the physical page.

In another embodiment, a temporary buffer, which contains the index page as well as the new data inserted in the right location, may be used to determine whether a change or changes will cause, after compression, the index page to exceed the size of the physical page. However, using a temporary buffer has a disadvantage of consuming valuable memory space.

In yet another embodiment, using comp_len, changes are inserted in the input data that is provided to the compressor, and the index page is not changed. In response to comp_len returning values for CLk and NCLk such that (CLk+NCLk+HL+KMAPL) is less than, and in some embodiments, equal to, the size of the physical page, the index page is modified. In various embodiments, additional input parameters are supplied to comp_len.

In various embodiments, comp_len also has an input parameter, that is, an insert/overwrite switch which specifies whether a key entry and/or rid will be inserted into the index page or whether a pseudo-delete will be performed. Using the insert/overwrite switch, comp_len can be used to determine whether inserting a new key entry, or performing a pseudo-delete, will fit in an index page without first modifying the index page. In some embodiments, the following input parameters are supplied to comp_len:
1) the index page;
2) a keymap index input pointer, k_input, which represents the value of the keymap index of the key entry being inserted, or alternately, the key entry being affected by the pseudo-delete, in the keymap;
3) the prefix and key data for the new key entry;
4) a ridindex which indicates the position of a rid of a key entry;
5) the value of the rid; and
6) the insert/overwrite switch.

For example, assume that there are four key entries as illustrated in FIG. 12, and that the value of the keymap index pointer k_p is equal to two which indicates that two key entries have been compressed, and that the compressed and uncompressed lengths have been determined by compressing the key entries which correspond to keymap[1] through keymap[k_p]. In this example, the first two key entries have been compressed. Now assume that a fifth key entry is added to the index page which, in keymap order, has a key with a value which is less than the key of key entry 2, that is, key(keymap[2]) but greater than the value of the key of key entry 1, that is, key(keymap[1]), therefore k_input is set equal to two. The ridindex is set equal to zero because the new rid will directly follow in key in the key entry. The insert/overwrite switch is set to indicate that the key entry is to be inserted.

In this example, comp_len provides key entry(keymap[1]), which is stored on the index page, to the compressor. Because the insert/overwrite switch is set to insert and the parameter k_input is set equal to two, comp_len provides the new key entry to the compressor. Next, comp_len provides key entry (keymap[2]) which is stored on the index page to the compressor.

In another example, the insert/overwrite switch is used in response to a pseudo-delete. A pseudo-delete marks a rid as deleted and does not physically remove the rid from the index page. For a pseudo-delete, the input parameters comprise:
1) the index page;
2) the keymap index input pointer, k_input, of the key entry whose rid is being pseudo-deleted);
3) a null pointer for the key data because the key is not being modified;
4) the ridindex of the rid to be pseudo-deleted;
5) the new rid prefix value; and
6) the insert/overwrite switch which indicates that data is to be overwritten.

In this example, for a pseudo-delete, when the keymap traversal algorithm reaches the keymap index input pointer, k_input, and the ridindex specified in the input parameters, the new rid-prefix value which was received as a parameter, is passed to the compressor. Since the insert/overwrite switch indicates that data is to be overwritten, comp_len will skip over the rid prefix on the index page that indicates that this rid is not pseudo-deleted, and provide the new rid prefix value which indicates that the rid following it is pseudo-deleted. In this way, comp_len determines the compressed length, CLk, as though the rid had been pseudo-deleted on the page itself.

Figure 20A:
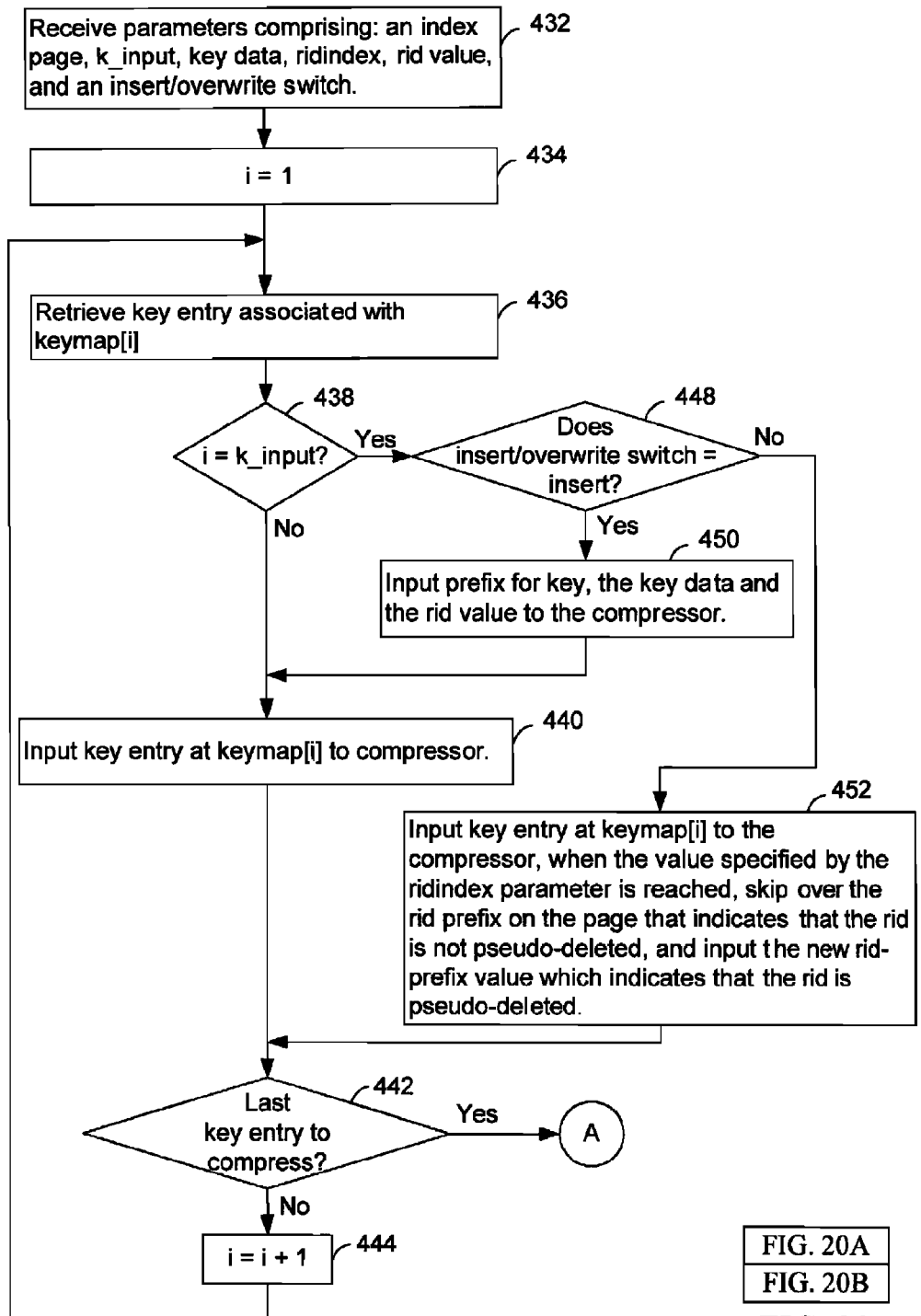
FIG. 20 comprises FIGS. 20A and 20B which collectively depict a flowchart of an embodiment of a compression module, referred to as comp_len.
Figure 20B:
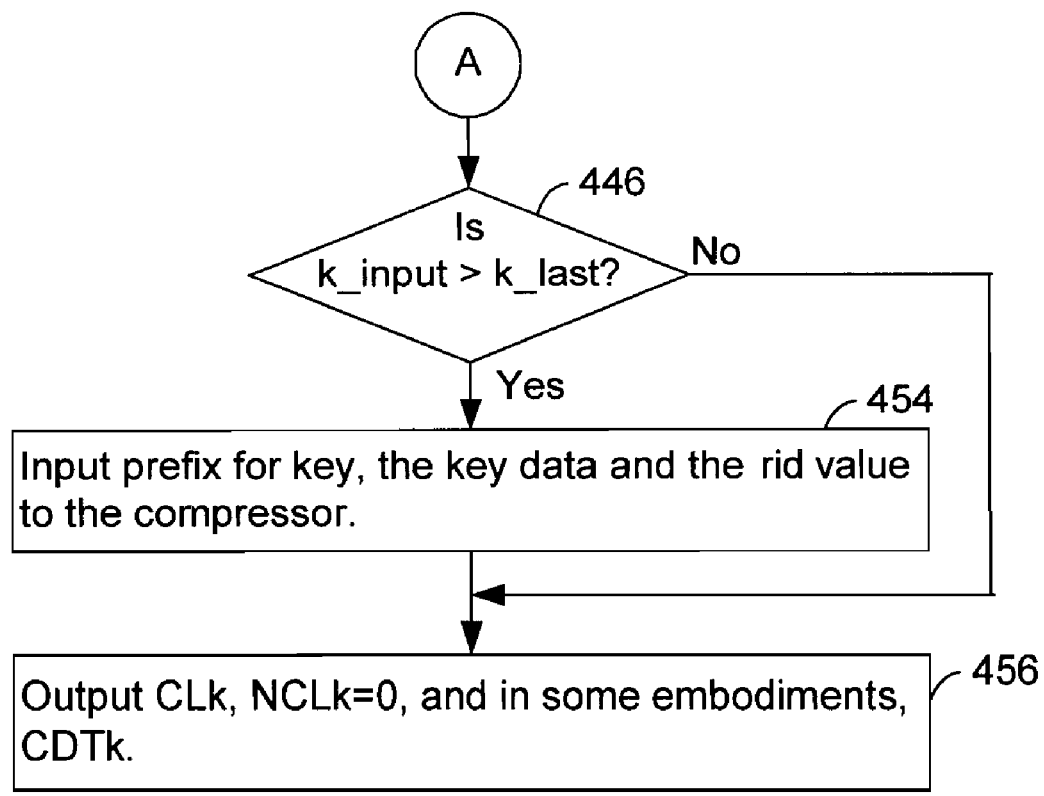

FIG. 20 comprises FIGS. 20A and 20B which collectively depict a flowchart of an embodiment of the compression module, referred to as comp_len. In various embodiments, the flowchart of FIG. 20 is implemented in the index management system of a database management system. In FIG. 20B, the keymap index variable called k_last is equal to num_offset(keymap); therefore, k_last references the end of the keymap.

In step 432, parameters comprising an index page, the keymap index input pointer k_input, the prefix and key data, a ridindex, a rid value, and an insert/overwrite switch are received. In response to the switch indicating insert, the parameter k_input indicates where the new key entry is to be inserted in the input stream to the compressor. In step 434, a counter, i, is set equal to one. In step 436, the key entry associated with keymap[i] is retrieved. Step 438 determines whether the value of i is equal to the value of k_input. If not, in step 440, the key entry at keymap[i] is input to the compressor. Step 442 determines whether the last key entry to compress has been compressed. In some embodiments, all key entries which are associated with an offset in the keymap are compressed. In other embodiments, less than all key entries associated with the keymap are compressed. If step 442 determines whether the last key entry has not been compressed, in step 444, the value of i is incremented by one, and step 444 proceeds to step 436.

If step 438 determines that the value of i is equal to the value of k_input, step 448 determines whether the insert/ overwrite switch indicates that a key is to be inserted. If so, in step 450, the prefix for the new key, the new key data and the rid value are input to the compressor, and step 450 proceeds to step 440. In this way, the new key entry is input to the compressor without writing the new key to the index page, and the compressed length of the index data with the new key can be determined.

If step 448 determines that the insert/overwrite switch indicates that the key is not to be inserted, then the key is to be pseudo-deleted. In step 452, the key entry at keymap[i] is input to the compressor. When the value specified by the ridindex parameter is reached as the key entry is being input, the rid prefix on the page that indicates that the rid is not pseudo-deleted is skipped, and the new rid-prefix value which indicates that the rid is pseudo-deleted is input to the compressor. The rid being pseudo-deleted and any subsequent rids are supplied to the compressor. In this way, the length of the compressed key entries in response to a pseudo-delete can be determined without performing the pseudo-delete.

If step 442 determines that the last key entry has been compressed, step 442 proceeds via Continuator A to step 446 of FIG. 20B. Step 446 determines whether k_input is greater than k_last. If so, in step 454, the prefix for the key, the key data and the rid value are input to the compressor. In this case the new key that is being inserted has a value beyond all the other keys on the index page, so that its associated keymap index k_input has a value greater than k_last, and would not have been processed in the flowchart of FIG. 20A. In step 456, the values of CLk, NCLk=0, and, in some embodiments, CDTk are output. If step 446 determines that k_input is not greater than k_last, step 446 proceeds to step 456.

Figure 21:
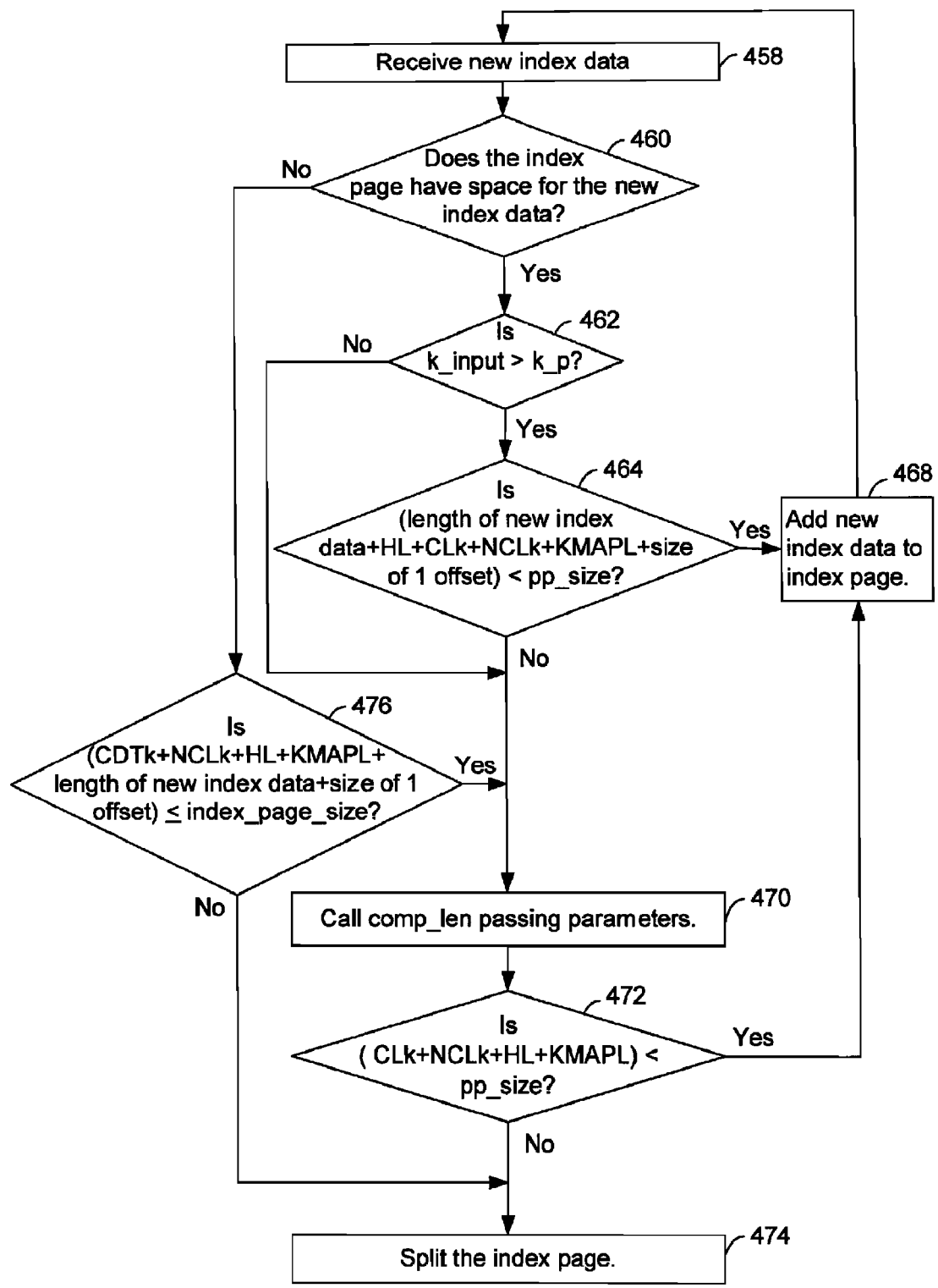
FIG. 21 depicts a flowchart of an embodiment of determining whether an index page is to be split based on calling the compression module, referred to as comp_len, of FIG. 20, in response to inserting new index data.

FIG. 21 depicts a flowchart of an embodiment of determining whether an index page is to be split based on calling the compression module, referred to as comp_len, of FIG. 20, in response to inserting new index data. In various embodiments, the flowchart of FIG. 21 is implemented in the index management system of a database management system. Initially, an index page does not contain any key entries or keymap elements. The keymap index of the new key entry to be inserted is k_input and the keymap index of the last key entry which was compressed is k_p. K_input is the keymap index input pointer indicating where the new key entry will be inserted. For example, an index page is initially empty and any new key entry will have a k_input value of one. The value of the keymap index up to which data has been compressed, k_p, is stored in the index page header. For an empty index page k_p has a value of zero because there no key entries and hence no keymap on the index page. In addition, k_p has a value of zero if the index page is not empty and all the key entries are uncompressed, which can happen if HL+CLk (=0)+NCLk+KMAPL is less than the physical page size. In this case, although k_p is equal to zero, k_input is equal to num_offset(keymap) and is not equal to zero.

In step 458, new index data is received. Step 460 determines whether the index page has space for the new index data. In some embodiments, the index manager searches for an unused location in the index page which is sufficiently large to contain the new index data.

If so, step 462 determines whether k_input is greater than k_p. If so, step 464 determines whether the (length of the new index data+HL+CLk+NCLk+KMAPL+size of 1 offset) is less than the physical page size (pp_size). If so, in step 468, the new index data is added to the index page. In this way, a compressibility check is avoided. Step 468 proceeds to step 462 to receive new index data.

In various embodiments, when k_input is greater than k_p and the (length of the new index data+HL+CLk+NCLk+KMAPL+size of 1 offset) is less than the physical page size (pp_size)), the new index data does not affect any key entries on the index page which are to be stored as compressed on the physical page. When k_input is not greater than k_p, the new index data affects key entries on the index page which are to be stored in a compressed format on the physical page. In some embodiments, when the (length of the new index data+HL+CLk+NCLk+KMAPL+size of 1 offset) is greater than or equal to the physical page size (pp_size), the new index data affects key entries on the index page which are to be stored in a compressed format because a compression check is performed and additional key entries may be compressed.

If step 464 determines that the length of the index data, which includes the new index data, plus the length of the header (HL), CLk, NCLk, the length of the keymap (KMAPL) and the size of one offset is not less than or equal to the physical page size (pp_size), in step 470, comp_len is called and the parameters are passed. The parameters comprise the index page, the keymap index input pointer k_input, the prefix and key of the new key entry, the rid of the new key entry, the ridindex with a value of zero, and the insert/overwrite switch set to insert. If a new key entry was added, comp_len also updates the length of the output keymap with the size of one offset; therefore, KMAPL comprises the size of one offset for the new key entry. In response to the return from comp_len, step 472 determines whether the compressed length (CLk) plus the length of any uncompressed key entries (NCLk) plus the length of the header (HL) plus the length of the keymap (KMAPL) is less than the physical page size (pp_size). If so, step 472 proceeds to step 468 to add the new index data to the index page. If not, in step 474, the index page is split, that is, a new index page is created.

If step 462 determines that k_input is less than or equal to k_p, step 462 proceeds to step 470 to call comp_len, passing the index page, k_input, the value of the prefix and key and rid, and the insert/overwrite switch set to insert.

If step 460 determines that the index page does not have space for the new index data, it is determined whether garbage collection, in which the holes in the index page are reclaimed and the key entries are laid out in keymap order will result in freeing up sufficient space to store the new index data. Since the page header contains values for CDTk and NCLk from the previous call to comp_len, step 476 determines whether sufficient space will be freed by computing the sum of (CDTk+NCLk+HL+KMAPL+length of new index data+size of one offset), and compares that sum to the index_page_size, that is, the in-memory index page size. If step 476 determines that the sum is less or equal to than the index page size, step 476 proceeds to step 470 to call comp_len. If step 476 determines that the sum is not less than or equal to the physical page size (pp_size), step 476 proceeds to step 474 to split the index page.

In various embodiments, the flowchart of FIG. 21 is used to insert a new key entry. In other embodiments, the flowchart of FIG. 21 is used to insert a new rid. In this embodiment, step 464 is modified as follows to determine if the (length of the new index data+HL+CLk+NCLk+KMAPL) is less than pp_size because no new keymap elements are created in response to adding a new rid.

For example, assume that comp_len has been called at least once so that existing values of the compressed length CLk, the uncompressed length NCLk, header length HL and keymap length KL are known and stored in the header. When new index data is being inserted, the index data may be a key entry having a new key-rid combination, or a rid which will be associated with an existing key. Therefore, either there is space in the index page to insert the new index data or there is no space and the index page will be split.

For example, assume that a new key entry is received (step 458), that the keymap index of the new data to be inserted is k_input and that the last key entry which was compressed is associated with a keymap index pointer of k_p. If there is sufficient space on the index page for the new index data to be inserted (step 460), the insert of the new data either affects a key entry that is associated with a keymap index less than or equal to k_p or greater than or equal to k_p. If the new index data affects a key entry that is associated with a keymap index which is greater than the value of k_p (step 462), then the new index data would be stored on the physical page in an uncompressed format. In this case the sum of CLk+NCLk+HL+KMAPL+length of the new index data+size of 1 offset is determined and compared to the physical page size (step 464). If this sum is less than or equal to the physical page size, pp_size, the on-disk page size, the index data is written to the index page and the keymap is updated (step 468). If the sum is greater than the physical page size, it is determined whether the entire index page with the new index data, can compress to less than the physical page size. In this case, comp_len is called (step 470), and the new data and keymap index and ridindex with the insert/overwrite switch parameter set to insert. In this example, comp_len returns a value of NCLk equal to zero because there will be no uncompressed data. If the sum of CLk returned by the call to comp_len plus HL plus KMAPL exceeds the physical page size (step 472), the index page will be split (step 474).

If the new index data affects a key entry having a keymap index which is less than or equal to the current k_p (step 462), then comp_len is called (step 470) with the insert/overwrite switch parameter set to insert to determine whether the compressed representation of the index data causes the index page to fit within the physical page size, as shown in FIG. 15B.

In an alternate embodiment, comp_len stops processing in response to reaching a keymap index for which CLk plus NCLk plus HL plus KMAPL is less than the physical page size. Therefore less than all of the key entries may be compressed. In this embodiment, comp_len may return a non-zero value for NCLk.

Index data may also be deleted from an index page. A delete may be a pseudo-delete or a physical delete. In the case of a delete, either the delete affects a key entry, associated with a keymap input index k_input, prior to the last compressed key entry associated with keymap index pointer k_p, that is, k_input is less than or equal to k_p, or the delete affects a key entry after the last compressed key entry, that is, k_input is greater than k_p. If the delete affects a key entry prior to the last compressed key entry or the last compressed key entry, comp_len is invoked to update CLk, to compress the index data up to k_p, or alternately, also one or more key entries beyond k_p if a pseudo-delete or a physical delete leads to expansion. In a pseudo-delete, comp_len replaces the existing rid prefix with the new rid prefix in the input stream to the compressor. In a physical delete, comp_len skips over, that is, does not supply the key entry to be deleted or rid(s) to be deleted to the compressor, to compute a new value for CLk.

If a delete affects a key entry associated with a keymap index greater than the keymap index of the last compressed key entry k_p, NCLk is updated if the delete is a physical delete. In the case of a pseudo-delete, the rid prefix is modified and NCLk is not changed. No calls to comp_len are made, that is no compressibility checking is performed because the amount of data that will be stored in an uncompressed format on the physical page either remains the same (pseudo-delete) or decreases (physical delete).

Figure 22:
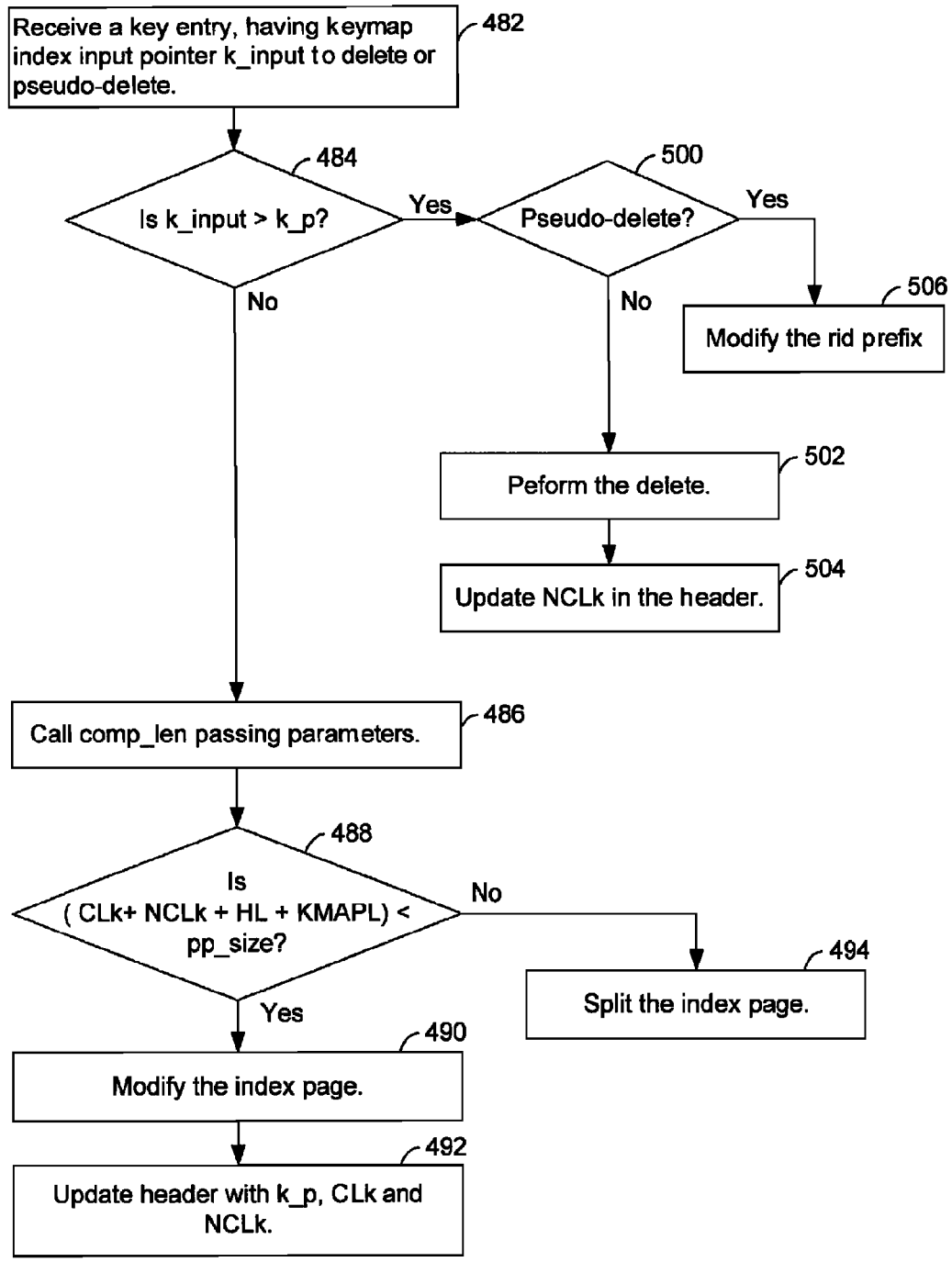
FIG. 22 depicts a flowchart of an embodiment of updating an index page in response to a delete.

FIG. 22 depicts a flowchart of an embodiment of updating an index page in response to a delete. In various embodiments, the flowchart of FIG. 22 is implemented in the index management system of a database management system. In step 482, a key entry having a keymap index input pointer, k_input, to delete or pseudo-delete is received. Step 484 determines whether k_input is greater than k_p. If not, in step 486, comp_len is called, passing parameters. In this case, the insert/overwrite switch is set to indicate overwrite, the index page is passed, the keymap index input pointer k_input is passed, the rid index may be set to indicate which particular rid is being deleted or pseudo-deleted, or may be set to zero if the entire key entry is being deleted or pseudo-deleted, and the key value is set to null.

Step 488 determines whether the sum of the compressed length, the length of the uncompressed area, the header length and keymap length, that is, (CLk+NCLk+HL+KMAPL) is less than the physical page size (pp_size). For a pseudo-delete, the size of the keymap does not change. For a physical delete of a key entry, the size of the keymap is decreased by one keymap element. If so, in step 490, the index page is modified by the delete or pseudo-delete. In step 492, the header is updated with k_p, CLk and NCLk.

If step 488 determines whether the sum of the compressed length, the length of the uncompressed area, the header length and keymap length, that is, (CLk+NCLk+HL+KMAPL) is not less than the physical page size (pp_size), in step 494, the index page is split.

If step 484 determines that k_input is greater than k_p, the delete is being performed to a key entry in the uncompressed area. Step 500 determines whether the delete is a pseudo-delete. If not, in step 502, the delete is performed. In step 504, the uncompressed area length (NCLk) is updated in the header of the index page. If step 500 determines that the delete is a pseudo-delete, in step 506, the rid prefix of the rid being pseudo-deleted of the key entry associated with k_input, is modified to indicate a pseudo-delete.

In another embodiment, the header and keymap are also compressed. The header is typically not compressed because it contains information such as the length of the compressed data which is used to tell the decompression algorithm how far into the input buffer it should read to get all the compressed data. However, various embodiments of the Ziv-Lempel compression algorithm create an endmarker which is a unique byte pattern that marks the end of the compressed output, that is, the endmarker is chosen such that it cannot appear as part of the compressed output data. Thus, in some embodiments, using the endmarker, the decompression algorithm does not need to know the length of the compressed data.

Figure 23:
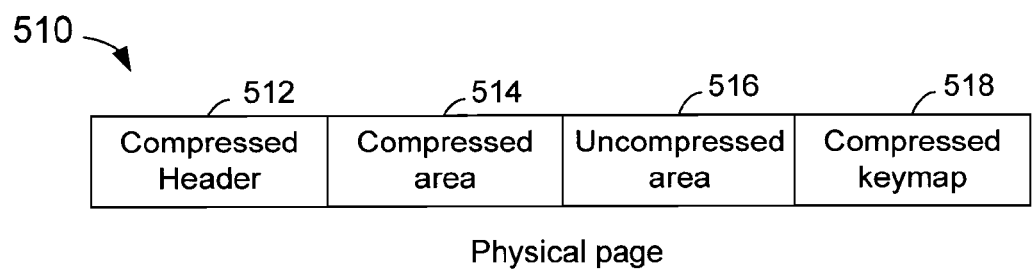
FIG. 23 depicts a diagram of an embodiment of a physical page comprising a compressed header, a compressed keymap, a compressed area and an uncompressed area.

FIG. 23 depicts a diagram of an embodiment of a physical page 510 comprising a compressed header 512, a compressed area 514, an uncompressed area 516 and a compressed keymap 518. Continuing the example of FIG. 12, the header 512 is compressed along with the first two key entries, key entry 1 and key entry 2, which form the compressed area 514. In some embodiments, the header 512 is part of the compressed area 514. The next two key entries, key entries 3 and 4, are stored in an uncompressed format and form an uncompressed area 516, and the keymap array is compressed in the compressed keymap 516 of the physical page 510. In this embodiment, the decompression algorithm skips over the uncompressed area. The decompression algorithm also recognizes the beginning of the compressed keymap array, so that after decompressing the keymap array, the decompression algorithm can move the keymap array to the bottom of the index page. The endmarker appears at the end of the compressed keymap array and is used by the decompression algorithm to determine the end of the keymap array. To determine the beginning of the uncompressed index data, the header contains the length of the compressed keys, in this example, the length of compressed version of key entry 1 and key entry 2.

This embodiment typically performs two passes through the index page. In the first pass, the number of key entries to compress is determined without compressing the index page. In the second pass, the header is updated with the compressed length of the key entries to be compressed, and also with the keymap index pointer k_p which indicates the end of the uncompressed key entries and compression is performed.

After decompressing into an output buffer, the decompression algorithm can find the length of the compressed key entries. For example, this enables the decompression algorithm to decompress key entry 1 and key entry 2 correctly. The header also contains the start of the contiguous free space which is at the end of key entry 3 and key entry 4. Thus the decompression algorithm can determine where the uncompressed key entries end and the compressed keymap begins.

In an alternate embodiment, the compressed keymap 518 is stored at the end of the physical page Typically, the header and keymap are not compressed because almost any change to the index page will result in an update to the header and/or keymap causing the compressor to be called to determine if the changed index page can fit into the physical page. Therefore, it is typically desirable to leave the header and keymap uncompressed even though compressing the header and keymap will increase the compression ratio.

Figure 24:
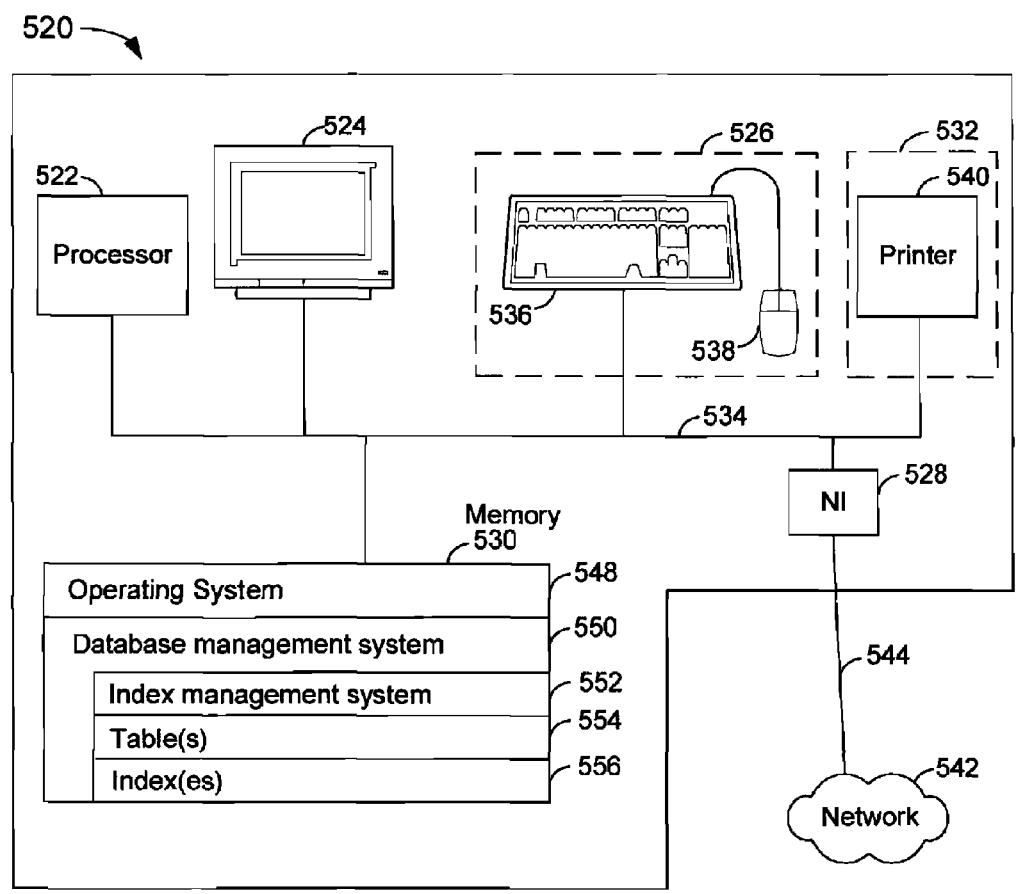
FIG. 24 depicts an illustrative computer system which uses various embodiments of the present invention.

FIG. 24 depicts an illustrative computer system 520 which uses various embodiments of the present invention. The computer system 520 comprises a processor 522, display 524, input interfaces (I/F) 526, communications interface 528, memory 530 and output interface(s) 532, all conventionally coupled by one or more buses 534. The input interfaces 526 comprise a keyboard 536 and a mouse 538. The output interface 532 comprises a printer 540. The communications interface 528 is a network interface (NI) that allows the computer 520 to communicate via a network 542, such as the Internet. The communications interface 528 may be coupled to a transmission medium 544 such as a network transmission line, for example twisted pair, coaxial cable or fiber optic cable. In another embodiment, the communications interface 528 provides a wireless interface, that is, the communications interface 528 uses a wireless transmission medium.

The memory 530 generally comprises different modalities, illustratively volatile memory such as semiconductor memory, such as random access memory (RAM), and persistent or non-volatile memory, such as, disk drives. In various embodiments, the memory 530 stores an operating system 548 and a database management system 550 comprising an index management system 552, table(s) 554 and index(es) 556.

In various embodiments, the specific software instructions, data structures and data that implement various embodiments of the present invention are typically incorporated in the database management system 550, and in some embodiments, the index management system 552, in various embodiments, the index(es) 556, and in yet other embodiments, the table(s) 554. Generally, an embodiment of the present invention is tangibly embodied in a computer-readable medium, for example, the memory 530 and is comprised of instructions which, when executed by the processor 522, causes the computer system 520 to utilize the present invention. The memory 530 may store the software instructions, data structures and data for any of the operating system 548 and the database management system 550, in semiconductor memory, in disk memory, or a combination thereof. Typically, an index page of the index 556 is stored in volatile memory, and the physical page of the index is stored in non-volatile or persistent memory.

The operating system 548 may be implemented by any conventional operating system such as z/OS® (Registered Trademark of International Business Machines Corporation), MVS® (Registered Trademark of International Business Machines Corporation), OS/390® (Registered Trademark of International Business Machines Corporation), AIX® (Registered Trademark of International Business Machines Corporation), UNIX® (UNIX is a registered trademark of the Open Group in the United States and other countries), WINDOWS® (Registered Trademark of Microsoft Corporation), LINUX® (Registered trademark of Linus Torvalds), Solaris® (Registered trademark of Sun Microsystems Inc.) and HP-UX® (Registered trademark of Hewlett-Packard Development Company, L.P.).

In various embodiments, the database management system 550 is the IBM® (Registered Trademark of International Business Machines Corporation) DB2® (Registered Trademark of International Business Machines Corporation) database management system. However, the invention is not meant to be limited to the IBM DB2 database management system and other database management systems may be used.

In various embodiments, the present invention may be implemented as a method, apparatus, or article of manufacture using standard programming and/or engineering techniques to produce software, firmware, hardware, or any combination thereof. The term "article of manufacture" (or alternatively, "computer program product") as used herein is intended to encompass a computer program accessible from any computer-readable device, carrier or media. In addition, the software in which various embodiments are implemented may be accessible through the transmission medium, for example, from a server over the network. The article of manufacture in which the code is implemented also encompasses transmission media, such as the network transmission line and wireless transmission media. Thus the article of manufacture also comprises the medium in which the code is embedded. Those skilled in the art will recognize that many modifications may be made to this configuration without departing from the scope of the present invention.

The exemplary computer system illustrated in FIG. 24 is not intended to limit the present invention. Other alternative hardware environments may be used without departing from the scope of the present invention.

Various embodiments have been described with respect to a key entry comprising a prefix, key and rids. However, in other embodiments, the invention may be used with key entries having a different format.

The foregoing detailed description of various embodiments of the invention has been presented for the purposes of illustration and description. It is not intended to be exhaustive or to limit the invention to the precise form disclosed. Many modifications and variations are possible in light of the above teachings. It is intended that the scope of the invention be limited not by this detailed description, but rather by the claims appended thereto.

What is claimed is:

1. A computer-implemented method, comprising:
   providing a first index page comprising a first plurality of key entries and a first keymap, said first index page being stored in a volatile memory, said first keymap indicating a sort order of said first plurality of key entries based on key values of said first plurality of key entries, said first keymap comprising respective positions of said key entries of said first plurality of key entries on said first index page, wherein said first plurality of key entries comprises a first key entry, a second key entry, and a third key entry; wherein said key values comprise a first key value, a second key value and a third key value; wherein said first key entry has said first key value, said second key entry has said second key value and said third key entry has said third key value, wherein said first keymap indicates that said second key value is between said first key value and said third key value; wherein said second key entry has a position in said first index page that is not between a position of said first key entry and a position of said third key entry in said first index page;

compressing said first plurality of key entries of said first index page in accordance with said sort order indicated by said first keymap of said first index page thereby providing a compressed first plurality of key entries;

generating a second keymap indicating said sort order of said first plurality of key entries and also comprising respective post-compression positions of said key entries of said first plurality of key entries; and storing a second index page in a persistent storage, said second index page comprising said compressed first plurality of key entries and said second keymap.

2. The method of claim 1 wherein said first index page has at least one hole between key entries of said first plurality of key entries; said at least one hole not being compressed; wherein said sort order is an order from a group consisting of an ascending order and a descending order.

3. The method of claim 1 wherein said first index page comprises a second plurality of key entries, wherein said first keymap indicates said sort order of said first plurality of key entries and said second plurality of key entries, wherein said generating said second keymap also indicates said sort order of said key entries of said second plurality of key entries, and said second keymap comprises respective positions of said key entries of said second plurality of key entries, said key entries of said second plurality of key entries being in an uncompressed format in said first index page, wherein said storing stores said second plurality of key entries in said uncompressed format in accordance with said sort order in said second index page.

4. The method of claim 3 wherein said first index page has at least one hole between said key entries of said second plurality of key entries, said at least one hole not being stored on said second index page.

5. The method of claim 3, further comprising:
receiving a new key entry;
determining whether said second index page has sufficient space to store said new key entry in said uncompressed format with said compressed first plurality of key entries and said second plurality of key entries based on a size of said second index page, a length of said compressed first plurality of key entries, a length of said second plurality of key entries and a length of said new key entry;
in response to said determining that said second index page has sufficient space to store said new key entry in said uncompressed format, writing said new key entry on said first index page; and
updating said first keymap based on said new key entry.

6. The method of claim 3 further comprising:
receiving a modification to a particular key entry of said first plurality of key entries of said first index page;
generating a new compressed length based on compressing a plurality of key entries of: said first plurality of key entries, said particular key entry with said modification and said second plurality of key entries, without writing said modification to said particular key entry on said first index page;
determining whether said second index page has sufficient space to store said first index page with said modification based on said new compressed length; and
in response to said determining that said second index page has sufficient space, writing said modification on said first index page.

7. The method of claim 1, wherein said first index page also comprises a second plurality of key entries, wherein a keymap pointer indicates said first plurality of key entries, further comprising:
receiving a new key entry comprising a new key;
identifying a new-key-entry keymap index to said first keymap based on said new key;
determining whether said new-key-entry keymap index is greater than said keymap pointer;
in response to said determining that said new-key-entry keymap index is greater than said keymap pointer, determining whether said second index page has sufficient space to store said new key entry in an uncompressed format;
in response to said determining that said second index page has sufficient space to store said new key entry in an uncompressed format, writing said new key entry on said first index page; and
updating said first keymap based on said new-key-entry keymap index and said new key entry.

8. The method of claim 7 further comprising:
in response to said determining that said new-key-entry keymap index is not greater than said keymap pointer, generating a new compressed length based on compressing a plurality of key entries of: said first plurality of key entries, said new key entry and said second plurality of key entries;
determining whether said second index page has sufficient space to store said new key entry in a compressed format based on said new compressed length; and
in response to said determining that said second index page has sufficient space to store said new key entry in a compressed format, writing said new key entry on said first index page.

9. The method of claim 1 wherein said first index page comprises a plurality of holes,
receiving a new key entry;
inserting said new key entry into one hole of said plurality of holes; and
updating said first keymap based on said new key entry.

10. The method of claim 1 further comprising:
decompressing said compressed key entries on said second index page to another index page, said another index page being in said volatile memory, said decompressed key entries of said another index page having said respective post-compression positions on said another index page in accordance with said second keymap of said second index page.

11. The method of claim 10 wherein said another index page has no hole between ones of said decompressed key entries.

12. The method of claim 1 wherein each key entry of said first plurality of key entries comprises a prefix, a key and at least one rid,
said compressing comprises:
compressing said prefix and key of said each key entry to provide compressed prefix-key data; and compressing said at least one rid of said each key entry to provide compressed rid data;

said storing comprises:

storing said compressed prefix-key data and said compressed rid data on said second index page.

13. The method of claim 1 further comprising:

compressing a header of said first index page;

compressing said second keymap; and wherein said storing also stores said compressed header, said second keymap being stored in a compressed format.

14. The method of claim 1 wherein said key values comprise data of at least one column of a table;

wherein said first keymap indicates that said second key value is between said first key value and said third key value concurrently with said second key entry having a position in said first index page that is not between a position of said first key entry and a position of said third key entry in said first index page;

wherein said second key value is between said first key value and said third key value comprises said first key value being less than said second key value, and said second key value being less than said third key value;

wherein said first index page has a first predetermined size; wherein said second index page has a second predetermined size; wherein said first predetermined size is greater than said second predetermined size.

15. A computer program product for maintaining a page, said computer program product comprising:

a computer readable storage medium;

first program instructions to provide a first index page comprising a first plurality of key entries and a first keymap, said first keymap indicating a sort order of said first plurality of key entries based on key values of said first plurality of key entries, said first keymap comprising respective positions of said key entries of said first plurality of key entries on said first index page, wherein said first plurality of key entries comprises a first key entry, a second key entry, and a third key entry; wherein said key values comprise a first key value, a second key value and a third key value; wherein said first key entry has said first key value, said second key entry has said second key value and said third key entry has said third key value, wherein said first keymap indicates that said second key value is between said first key value and said third key value; wherein said second key entry has a position in said first index page that is not between a position of said first key entry and a position of said third key entry in said first index page;

second program instructions to compress said first plurality of key entries of a first index page in accordance with said sort order indicated by said first keymap of said first index page thereby providing a compressed first plurality of key entries;

third program instructions to generate a second keymap indicating said sort order of said first plurality of key entries and also comprising respective post-compression positions of said key entries of said first plurality of key entries; and fourth program instructions to store a second index page, said second index page comprising said compressed first plurality of key entries and said second keymap;

wherein said first, second, third and fourth program instructions are stored on said computer readable storage medium.

16. The computer program product of claim 15 wherein said first index page is stored in volatile memory and said second index page is stored in persistent storage.

17. The computer program product of claim 15 wherein said first index page comprises a second plurality of key entries, wherein said first keymap indicates said sort order of said first plurality of key entries and said second plurality of key entries, wherein second keymap is generated to also indicate said sort order of said key entries of said second plurality of key entries, and said second keymap comprises respective positions of said key entries of said second plurality of key entries, said key entries of said second plurality of key entries being in an uncompressed format in said first index page, wherein said second plurality of key entries are stored in said uncompressed format in accordance with said sort order in said second index page.

18. The computer program product of claim 15 wherein said first index page also comprises a second plurality of key entries, further comprising:

fifth program instructions to receive a new key entry;

sixth program instructions to determine whether said second index page has sufficient space to store said new key entry in said uncompressed format with said compressed first plurality of key entries and said second plurality of key entries based on a size of said second index page, a length of said compressed first plurality of key entries, a length of said second plurality of key entries and a length of said new key entry;

seventh program instructions to, in response to said second index page having sufficient space to store said new key entry in said uncompressed format, write said new key entry on said first index page; and eighth program instructions to update said first keymap based on said new key entry;

wherein said fifth, sixth, seventh and eighth program instructions are stored on said computer readable storage medium.

19. The computer program product of claim 15, further comprising:

fifth program instructions to receive a modification to a particular key entry of said first plurality of key entries of said first index page;

sixth program instructions to generate a new compressed length based on compressing a plurality of key entries of: said first plurality of key entries, said particular key entry with said modification and said second plurality of key entries, without writing said modification to said particular key entry on said first index page;

seventh program instructions to determine whether said second index page has sufficient space to store said first index page with said modification based on said new compressed length; and eighth program instructions to in response to said second index page having sufficient space, write said modification on said first index page;

wherein said fifth, sixth, seventh and eighth program instructions are stored on said computer readable storage medium.

20. The computer program product of claim 15, further comprising:

fifth program instructions to decompress said compressed key entries on said second index page to another index page, said second index page being stored in a persistent storage device, said another index page being in a non-persistent storage device, said decompressed key entries having respective positions on said another index page in accordance with said second keymap;

wherein said fifth program instructions are stored on said computer readable storage medium.

21. A system comprising:

a processor; and a memory storing instructions, said instructions being executable by said processor, said instructions to:

provide a first index page comprising a first plurality of key entries and a first keymap, said first index page being stored in a volatile memory, said first keymap indicating a sort order of said first plurality of key entries based on key values of said first plurality of key entries, said first keymap comprising respective positions of said key entries of said first plurality of key entries on said first index page, wherein said first plurality of key entries comprises a first key entry, a second key entry, and a third key entry; wherein said key values comprise a first key value, a second key value and a third key value; wherein said first key entry has said first key value, said second key entry has said second key value and said third key entry has said third key value, wherein said first keymap indicates that said second key value is between said first key value and said third key value; wherein said second key entry has a position in said first index page that is not between a position of said first key entry and a position of said third key entry in said first index page;

compress said first plurality of key entries of said first index page in accordance with said sort order indicated by said first keymap of said first index page thereby providing a compressed first plurality of key entries;

generate a second keymap indicating said sort order of said first plurality of key entries and also comprising respective post-compression positions of said key entries of said first plurality of key entries; and store a second index page in a persistent storage, said second index page comprising said compressed first plurality of key entries and said second keymap.

* * * * *